(12) United States Patent
Chin et al.

(10) Patent No.: US 12,081,017 B2
(45) Date of Patent: Sep. 3, 2024

(54) OVERCURRENT PROTECTION BY DEPLETION MODE MOSFET OR JFET AND BI-METALLIC TEMPERATURE SENSING SWITCH IN MINI CIRCUIT BREAKER

(71) Applicant: Littelfuse, Inc., Chicago, IL (US)

(72) Inventors: Chuan Fang Chin, Taipei (TW); Teddy To, Tsuen Wan (HK)

(73) Assignee: Littelfuse, Inc., Chicago, IL (US)

( * ) Notice: Subject to any disclaimer, the term of this patent is extended or adjusted under 35 U.S.C. 154(b) by 157 days.

(21) Appl. No.: 17/869,179

(22) Filed: Jul. 20, 2022

(65) Prior Publication Data

US 2022/0368127 A1 Nov. 17, 2022

Related U.S. Application Data

(63) Continuation-in-part of application No. 17/237,500, filed on Apr. 22, 2021, now Pat. No. 11,637,423, which is a continuation-in-part of application No. 17/018,269, filed on Sep. 11, 2020, now Pat. No. 11,362,650.

(51) Int. Cl.
| | |
|---|---|
| *H02H 9/02* | (2006.01) |
| *H01L 27/02* | (2006.01) |
| *H02H 9/00* | (2006.01) |
| *H02H 9/08* | (2006.01) |
| *H03K 17/687* | (2006.01) |

(52) U.S. Cl.
CPC ........... *H02H 9/025* (2013.01); *H03K 17/687* (2013.01); *H03K 2017/6875* (2013.01)

(58) Field of Classification Search
CPC .......... H02H 3/08; H02H 3/025; H02H 9/004; H01L 27/0248
See application file for complete search history.

(56) References Cited

U.S. PATENT DOCUMENTS

2016/0032885 A1 * 2/2016 Vogelbacher ........ H01H 37/761
361/104
2017/0276115 A1 * 9/2017 Vogelbacher ......... F02P 19/027
(Continued)

FOREIGN PATENT DOCUMENTS

| CN | 202633908 U | * 12/2012 |
| CN | 203289087 U | * 11/2013 |
| DE | 202015106694 U1 | 5/2016 |

(Continued)

OTHER PUBLICATIONS

Extended European Search Report and Written Opinion mailed Sep. 20, 2022 for corresponding European Patent Application No. 22169345.0.

*Primary Examiner* — Sisay G Tiku
(74) *Attorney, Agent, or Firm* — KDW Firm PLLC

(57) ABSTRACT

A miniature circuit breaker for providing short circuit and overload protection is disclosed herein. The miniature circuit breaker features a field effect transistor (FET), which may be a depletion mode metal oxide semiconductor FET (D MOSFET), a junction field-effect transistor (JFET), or a silicon carbide JFET, the FET being connected to a bi-metallic switch, where the bi-metallic switch acts as a temperature sensing circuit breaker. In combination, the D MOSFET and bi-metallic switch are able to limit current to downstream circuit components, thus protecting the components from damage.

15 Claims, 26 Drawing Sheets

(56) References Cited

U.S. PATENT DOCUMENTS

2019/0132918 A1* 5/2019 Xu .................... H05B 47/16
2020/0059084 A1* 2/2020 Morioka ............... H02J 7/0024

FOREIGN PATENT DOCUMENTS

| EP | 3968517 A1 | 3/2022 | | |
|----|------------|--------|----|----|
| KR | 20060050897 A | * | 5/2006 | |
| WO | 2009117762 A1 | | 10/2009 | |
| WO | WO-2023274930 A1 | * | 1/2023 | ............. H01H 87/00 |

* cited by examiner

| Model | Fuse | Load Values | Current | Volts | Vgs | Time to trip |
|---|---|---|---|---|---|---|
| IXTH16N50D2 | KSD-01F(60C) | 0ohm | 6A | 1.06V | / | 17.5S |
| | | 0ohm | 8A | 1.89V | / | 8S |
| | | 0ohm | 10A | 2.95V | / | 5.8S |
| | | 0ohm | 12A | 4.27V | / | 3.7S |
| | | 0ohm | 14A | 7.2V | / | 2.5S |
| | | 0ohm | 16A | 8.8V | / | 1.75S |
| | | 0ohm | 20A | 13.4V | / | 0.8S |
| | | 0ohm | 24A | 33.2V | / | 0.65S |
| No | KSD-01F(60C) | / | 6A | | | No trip (temperature ~43C) |
| | | / | 8A | | | 48S~57S |
| | | / | 10A | | | 19S |
| | | / | 12A | | | 8S |
| | | / | 14A | | | 4.5S |
| | | / | 16A | | | 2.3S |
| | | / | 20A | | | 1.4S |
| | | / | 24A | | | 0.82S |

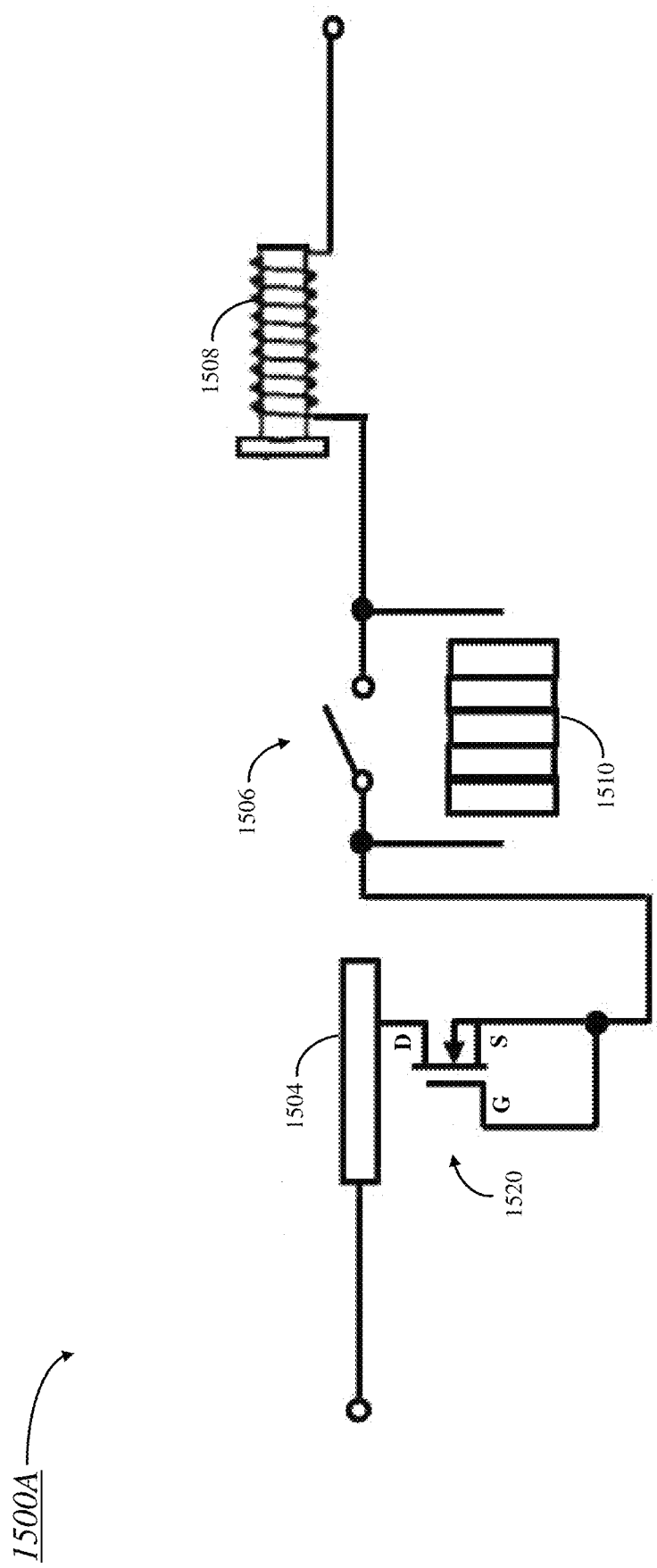

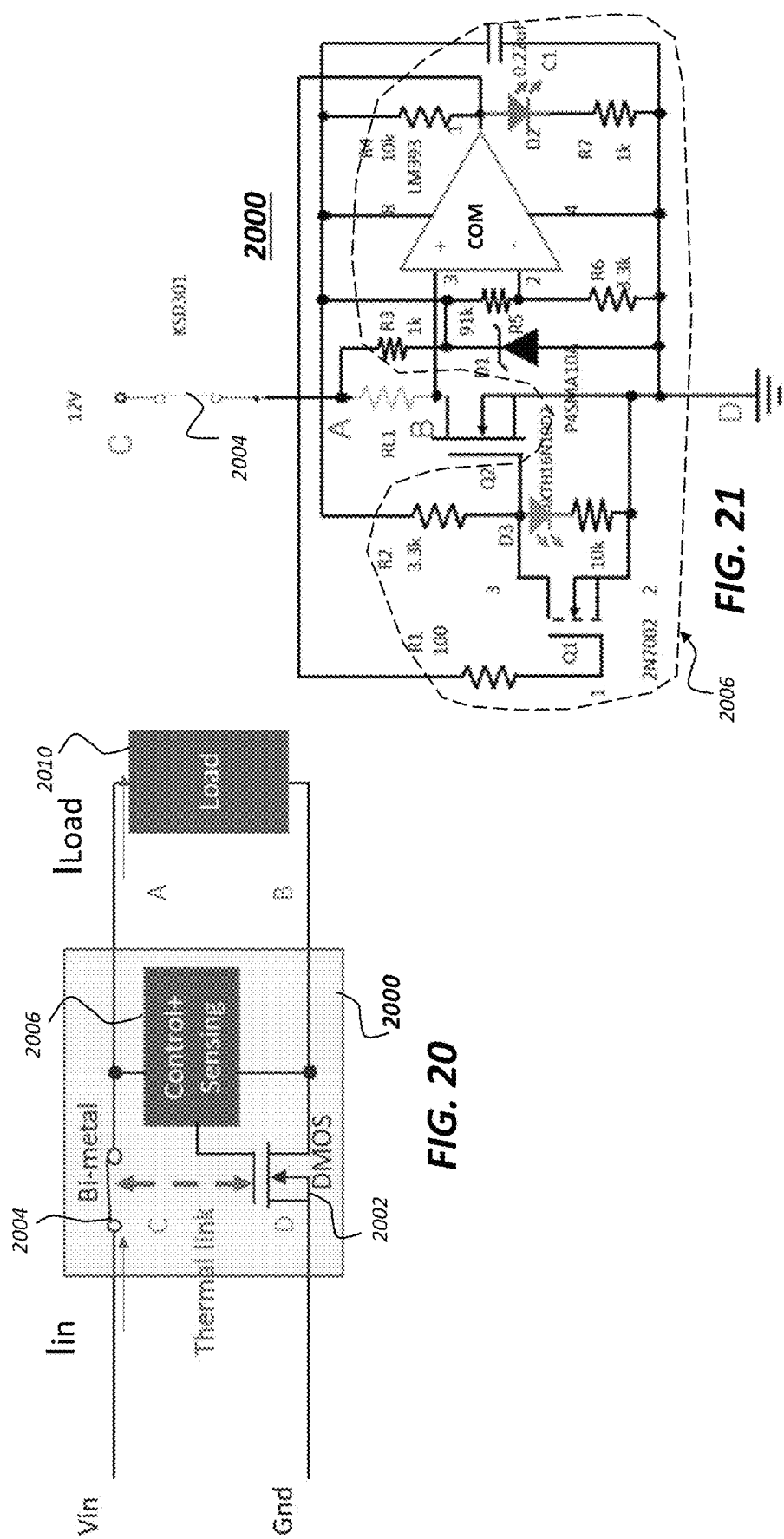

Case 3 - DC 12V suffer load dump transient 5a (87V, 1.5ohm, 400mS)

Test condition: 87V 1.5ohm 400mS ISO7637-2 5a Load dump test ( RL set at 1ohm @ DC+12V )

OVERCURRENT PROTECTION BY DEPLETION MODE MOSFET OR JFET AND BI-METALLIC TEMPERATURE SENSING SWITCH IN MINI CIRCUIT BREAKER

CROSS-REFERENCE TO RELATED APPLICATIONS

This application claims priority to and is a continuation-in-part of U.S. application Ser. No. 17/237,500 filed Apr. 22, 2021, which is a continuation-in-part of U.S. application Ser. No. 17/018,269, filed on Sep. 11, 2020, now U.S. Pat. No. 11,362,650 issued Jun. 14, 2022.

BACKGROUND

Overcurrent or excess current is a situation in which a larger than intended electrical current flows through a circuit. Overcurrent may be constant or transient in nature. Voltage transients, short duration surges of electrical energy, are the result of the sudden release of energy previously stored or induced by other means, such as heavy inductive loads or lightning. Repeatable transients are frequently caused by the operation of motors, generators, or the switching of reactive circuit components. Random transients, may be caused by lightning and Electrostatic Discharge (ESD).

Component miniaturization has resulted in increased sensitivity to electrical stresses. Microprocessors for example, have structures and conductive paths which are unable to handle high currents from ESD transients. Such components operate at very low voltages, so a high priority is given to controlling voltage disturbances to prevent device interruption and latent or catastrophic failures.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a miniature circuit breaker operable to provide protection due to short circuits or overload events is disclosed. The miniature circuit breaker includes a switch to be manually opened or closed by an external lever, but which opens automatically in response to either a first fault event or a second fault event. The miniature circuit breaker also includes a magnetic coil to open the switch in response to the first fault event, a bi-metallic strip, and a field effect transistor (FET) connected in series with the bi-metallic strip, where a gate terminal and a source terminal of the FET are connected to one another. The bi-metallic strip and the FET open the switch during the second fault event.

Another exemplary embodiment of a miniature circuit breaker in accordance with the present disclosure may include a bi-metallic strip, a field effect transistor (FET), and a switch. The bi-metallic strip includes an elongated metal strip and a metal winding wrapped around the strip. The elongated metal strip bends if the current rating of the miniature circuit breaker is exceeded. After removing the metal winding from the elongated metal strip, the FET is connected in series with and thermally tied to the elongated metal strip. The FET has a gate terminal connected to a source terminal. When a current exceeding the current rating of the miniature circuit breaker comes into the miniature circuit breaker, the switch opens due to the bending of the elongated metal strip. The FET provides current limiting above the rated current.

BRIEF DESCRIPTION OF THE DRAWINGS

FIGS. 15A and 15B are circuit diagrams of a miniature circuit breaker with a D MOSFET, in accordance with exemplary embodiments;

FIG. 20 depicts a diagram illustrating a protection circuit including a bi-metallic switch and a D MOSFET, in accordance with exemplary embodiments;

FIG. 21 depicts details of a variant of the protection circuit of FIG. 20;

DETAILED DESCRIPTION

Figure 1:
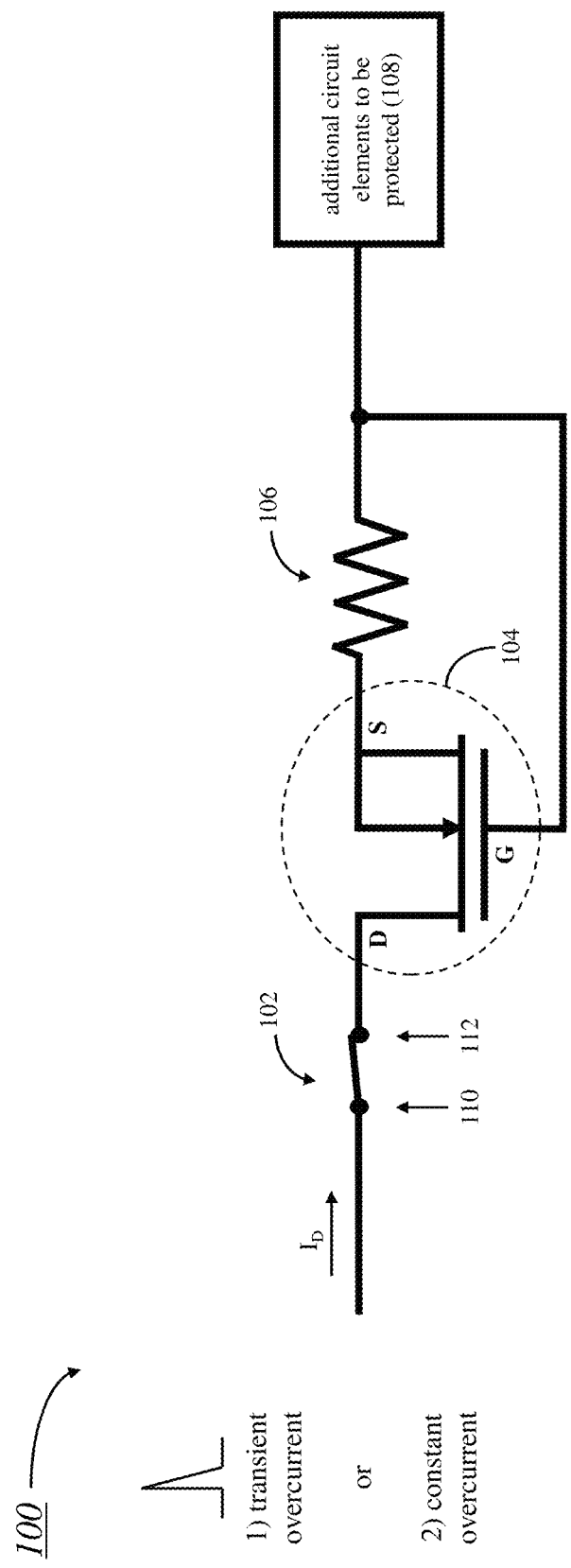
FIG. 1 is a diagram illustrating a protection circuit including a bi-metallic switch and a D MOSFET, in accordance with exemplary embodiments.

Circuits for providing overcurrent and overvoltage protection are disclosed herein. The circuits feature a depletion mode MOSFET (D MOSFET) as a current limiter, the D MOSFET being connected to a bi-metallic switch, where the bi-metallic switch acts as a temperature sensing circuit breaker. In combination, the D MOSFET and bi-metallic switch are able to limit current to downstream circuit components, thus protecting the components from damage.

Further, Mini Circuit Breakers (MCBs) for providing overcurrent and overvoltage protection are disclosed herein. The MCBs feature either a depletion mode MOSFET (D MOSFET) or a junction field effect transistor (JFET) as a current limiter, the D MOSFET or JFET being connected to a bi-metallic strip, where the bi-metallic strip acts as a temperature sensing circuit breaker. In combination, the D MOSFET or JFET and bi-metallic strip are able to limit current to downstream circuit components, thus protecting the components from damage.

Metal-Oxide Semiconductor Field-Effect Transistor devices, known as MOSFETs, are semiconductor devices used for switching and amplifying electronic signals in electronic devices. By adjusting a voltage on its gate, the width of a channel disposed between the source and drain of the MOSFET is varied. MOSFETs come in a variety of configurations, based on whether they are P-channel devices built with N-type substrates, N-channel devices built with P-type substrates, vertically disposed semiconductors, laterally disposed semiconductors, depletion mode, and enhancement mode.

In contrast to enhancement mode MOSFETs, which are turned on by the application of a voltage across the gate, depletion mode MOSFETs are known as "normally-on" devices when the gate terminal is at zero volts ($V_{GS}=0$ V). In addition to having a thin gate oxide between the source and drain regions, a conductive channel is formed beneath the gate oxide layer and between the source and drain regions using ion implantation. The concentration of active dopants in the substrate-to-channel region is used to adjust the threshold voltage ($V_{Th}$) of the MOSFET to a desired value. Despite the name, many modern MOSFETs may be manufactured with a polysilicon gate, rather than metal, atop the insulating gate oxide.

Bi-metallic switches are switches consisting of two metal strips that are joined together (back-to-back). The bi-metallic switch would be placed in a circuit between two connection points. The first metal strip has a first thermal expansion coefficient and the second metal strip has a second, different thermal expansion coefficient. Upon application of heat to the bi-metallic switch, the switch will temporarily deform, or bend, based on these two different thermal expansion coefficients once the temperature exceeds an "open" threshold. Where the bi-metallic switch consists of two back-to-back strips of metal of a predefined length, the application of heat will cause the switch to "shorten" or one end to "lift" such that the switch no longer maintains the predefined length, thus becoming unattached to both connection points of the circuit, resulting in an open circuit condition. Where the bi-metallic switch is part of a manufactured package (such as a KSD-01F Temperature Switch Thermostat, discussed further below), the package includes two extending legs that will change their relative positions during heating, thus resulting in the disconnect from the connection points of the circuit, resulting in the open circuit condition. In either configuration, once the bi-metallic switch cools down again, the switch will unbend or conform back to its original shape (which is generally flat), thus causing the switch to be again attached between the two connection points and closing the circuit.

FIG. 1 is a representative drawing of a protection circuit 100, according to exemplary embodiments. The protection circuit 100 (also known herein as "circuit") consists of a bi-metallic switch 102 and a depletion mode MOSFET 104 (hereinafter, "D MOSFET" or "MOSFET") connected in series with one another. The D MOSFET 104 includes a drain (D) and source (S), through which current flows, and a gate (G) which, under certain voltage conditions, will affect current flow between the drain and source. As a depletion mode device, the D MOSFET 104 is normally "on", with current flowing between drain (D) and source (S), despite the gate (G) voltage being 0 V. The bi-metallic switch 102 provides an electrical path between nodes 110 and 112 when the switch is closed, and causes an open circuit when the switch is not closed. One end of the bi-metallic switch 102 also connects to the drain (D) of the D MOSFET 104.

The protection circuit 100 further includes a resistor 106, connected at a first end to the source (S) of the MOSFET 104 and at a second end to the gate (G) of the MOSFET. The voltage across the resistor 106 is thus the same as the gate-to-source voltage of the MOSFET 104. The second end of the resistor 106 (as well as the gate of the MOSFET 104) connect to additional circuit elements to be protected 108, which are downstream of the already described circuit elements and shown generally in FIG. 1.

In exemplary embodiments, the D MOSFET 104 is a current limiter and the bi-metallic switch 102 acts as a temperature sensing circuit breaker. The bi-metallic switch 102 of the protection circuit 100 consists of two different metal strips attached to one another back-to-back. The first metal strip has a first thermal expansion coefficient and the second metal strip has a second, different thermal expansion coefficient. This difference causes the switch 102 to exhibit a temporary deformation (such as a bend) when the temperature sensed by the bi-metallic switch exceeds a threshold temperature. The temporary deformation causes the bi-metallic switch 102 to no longer connect to both nodes 110 and 112, resulting in an open circuit. Because the threshold temperature causes the bi-metallic switch 102 to open the protection circuit 100, the threshold temperature is also known herein as the "open threshold temperature" and the "trip point" or "time to trip" temperature.

In exemplary embodiments, the combination of the bi-metallic switch 102 and D MOSFET 104 provide overcurrent protection to the circuit 100. The overcurrent condition may be characterized as either 1) a transient overcurrent or 2) a constant overcurrent, as illustrated in FIG. 1. Once there is an overcurrent condition, the D MOSFET 104 generates heat, which activates the thermal sensing characteristics of the bi-metallic switch 102. The temporary deformation of the bi-metallic switch 102 means that the open threshold temperature was reached, such that the bi-metallic switch 102 fails to connect to one or more of nodes 110 and 112 of the circuit 100, resulting in the open circuit.

Once the fault overcurrent condition subsides, the two metal strips of the bi-metallic switch 102 will cool down, causing the switch to return from the temporarily deformed state to its original state. This causes the bi-metallic switch 102 to again establish connection between both nodes 110 and 112 of the circuit 100, resulting in a closed circuit. The bi-metallic switch 102 thus provides a circuit breaking condition of the protection circuit 100, which is a fail-safe environment for safe-guarding the other electronics systems or devices within the circuit (indicated in FIG. 1 as "additional circuit elements 108").

Within the protection circuit 100, the D MOSFET 104 is able to provide a fast response and blocking capability to overcurrent and overvoltage events and is able to quickly clamp surge current events. The overcurrent clamping capability of the D MOSFET absorbs fast transient surge energy, which protects some harmful transient surges from reaching into the sensitive electronics (additional circuit elements 108) to be protected.

In contrast, the bi-metallic switch 102 provides a high current breaking capability. However, the bi-metallic switch 102 is unable to respond quickly to protect against fast transient events. The combination of the bi-metallic switch 102 and the D MOSFET 104 thus helps utilize the advantages of both devices to provide improvement in overcurrent and overvoltage protection, in exemplary embodiments.

In an exemplary embodiment, the D MOSFET 104 is a IXTH16N50D2 depletion mode MOSFET (with $V_{DSX}$=500V, $I_{D(on)}$=16 A, $R_{DS(on)}$=300 mOhm), manufactured by Littelfuse® and the bi-metallic switch 102 is a KSD-01F Temperature Switch Thermostat, manufactured by Dongguan Fukuanyuan Electronics Co. Ltd (fuyuanfuse.com). As shown in FIG. 1, the bi-metallic switch 102 is connected to the input terminal drain (D) pin of the D MOSFET 104. The resistor 106 is connected between the G-S terminals of the D MOSFET 104. The bi-metallic switch 102 acts as a conducting switch. During normal operation, the bi-metallic switch 102 allows current to pass through it, providing that the current does not exceed the open threshold temperature (this may also be thought of as a "trigger level" for the bi-metallic switch 102).

A drain current of the MOSFET 104, shown as $I_D$, starts to flow through the D-S terminal of the D MOSFET 104 until the gate-to-source voltage, $V_{GS}$, potential difference ($I_D \times R$) reaches a level which causes a more negative $V_{GS}$ to block further current from passing through the D MOSFET 104. In one embodiment, as the applied voltage increases, the current flow will increase in linear mode until a saturation state is achieved. A balance is achieved in which the combination circuit (including the bi-metallic switch 102 and the D MOSFET 104) will allow a maximum saturation current, $I_{sat}$, of the D MOSFET to flow through the circuit 100. In this state, energy is also being dissipated in the D MOSFET 104, with $I_{sat} \times V_{DS}$, as heat as well.

In exemplary embodiments, the saturation current, $I_{sat}$, is the maximum steady state current passing through the D MOSFET 104. This means that as long as the saturation current is not exceeded, the D MOSFET will maintain functionality without chip failure or failure due to overheating. If the overload current is less than $I_{sat}$, the D MOSFET 104 still dissipates the energy as heat without any problem. However, if there is a very high short circuit at the input side that reaches into the D MOSFET, thus exceeding its $I_{sat}$ (saturation current) value, the D MOSFET will react quickly and dissipate the excessive current into heat more quickly. This, in turn, causes a higher temperature increase of the outer packaging of the D MOSFET 104 to quickly trip the bi-metallic switch 102, which stops further current from breaking the D MOSFET. Nevertheless, prolonged current going beyond the MOSFET's saturation current, $I_{sat}$, will cause over-heating of the D MOSFET to exceed its maximum junction temperature, resulting in chip failure, and loss of MOSFET function. Thus, the bi-metallic switch helps protect the D MOSFET from over-heating failure as well.

In an exemplary embodiment, the protection circuit 100 is operated with an applied current ranging from 0 A up to the $I_{sat}$ saturation current. An abnormal condition may result in a sudden rise of the input current, $I_D$. The abnormal condition may be caused, for example, by a short circuit on the load, load switching, or a sudden overload condition. These cause an up-surge of current passing through the bi-metallic switch 102 and the D MOSFET 104. If this current stays below the saturation current, $I_{sat}$, the D MOSFET will gradually heat up due to power dissipation to the MOSFET. However, if the overcurrent exceeds the saturation current $I_{sat}$, then there will be a dramatic increase in input current, $I_D$, with heat dissipation to the D MOSFET ($I_D \times V_{DS}$), resulting in the bi-metallic switch tripping even faster to protect the D MOSFET. This will cause the bi-metallic switch 102 to reach its disconnect level, thus disconnecting from one or more of the nodes 110, 112, at the open threshold temperature. Thus, the bi-metallic switch also provides cut-off protection to the D MOSFET within the safe operating area and thermal limit.

In one embodiment, when the disconnection at nodes 110 and/or 112 occurs, the overall current flowing through the protection circuit 100 is cut off, which removes current flow to the D MOSFET 104, causing heat dissipation of the MOSFET, and ultimately saves the D MOSFET from overheating by removing the sustained overcurrent.

The protection circuit 100 thus advantageously provides a feedback mechanism that tends to provide quicker protection to the D MOSFET 104 as the severity of the short circuit current event increases. Thus, the higher the level of short circuit current, the more quickly the bi-metallic switch 102 is able to cut off current to the D MOSFET 104, and thus protect the D MOSFET from overheating damage. This feedback arises because the high heat generated by the D MOSFET 104 from the overvoltage/overcurrent condition causes the bi-metallic switch 102 to open more quickly, thus preventing further current from passing through the D MOSFET and removing this self-heating, and ultimately protecting the downstream additional circuit elements 108.

Figure 2:
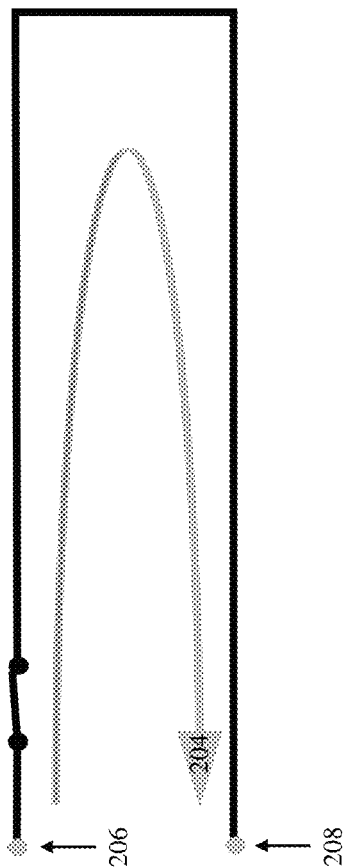
FIG. 2 is a diagram illustrating a protection circuit including a standalone bi-metallic switch, in accordance with exemplary embodiments.
Figure 3:
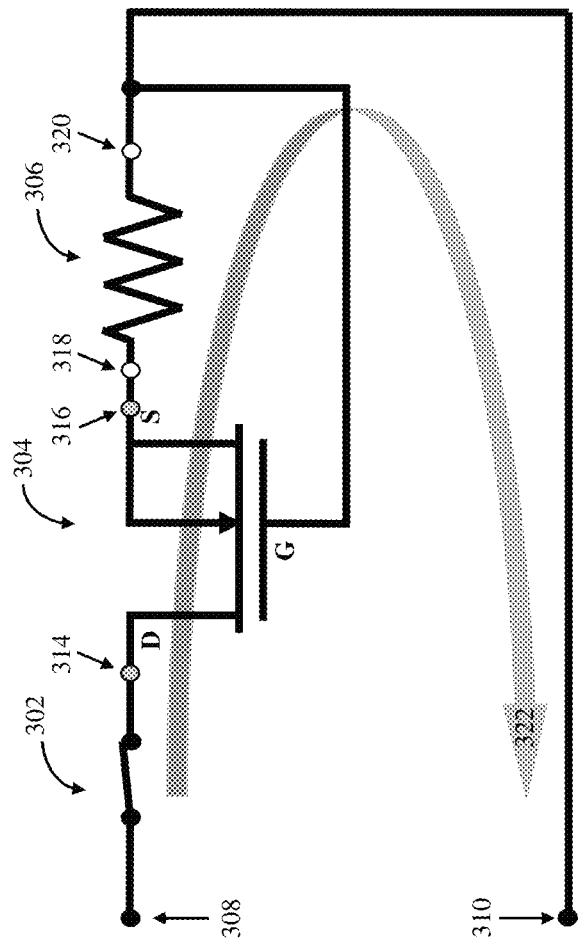
FIG. 3 is a diagram of a device for providing overcurrent protection to a circuit, in accordance with exemplary embodiments.
Figure 4:
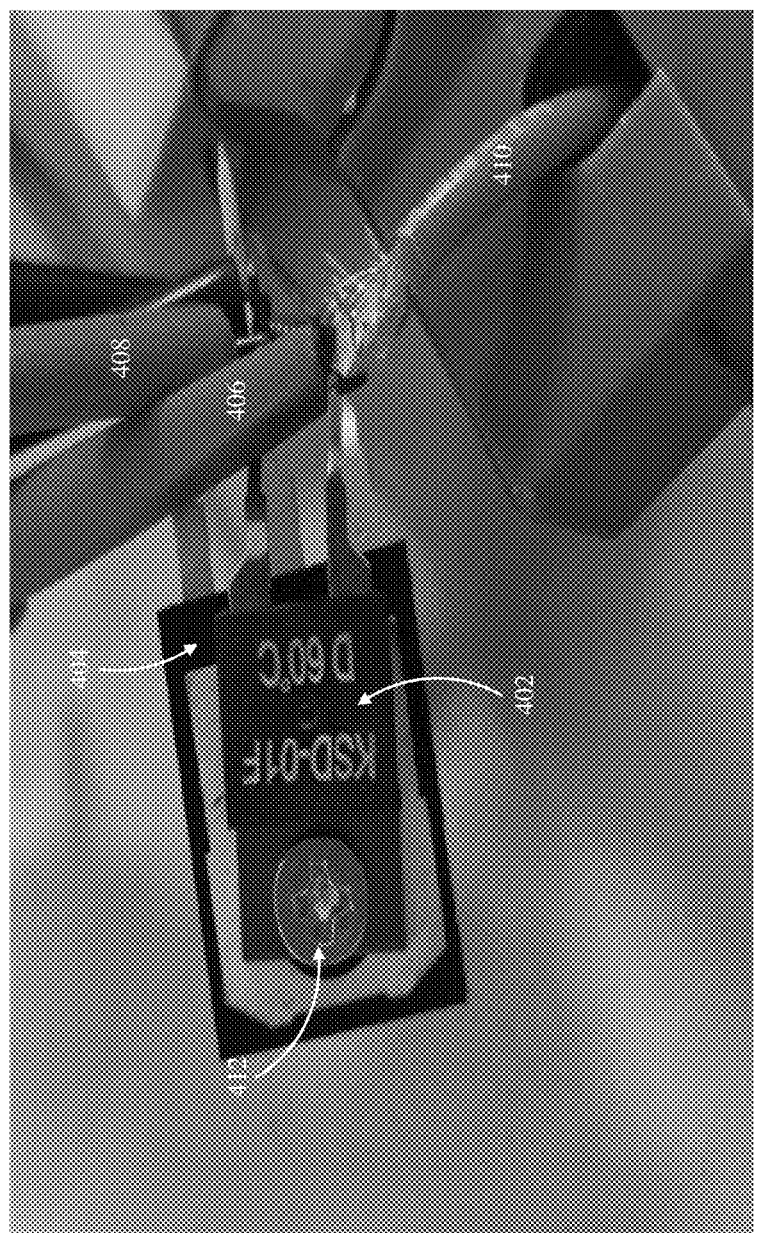
FIG. 4 is an illustration of a bi-metallic switch screwed and bolted to a D MOSFET, in accordance with exemplary embodiments.

FIGS. 2, 3, and 4 are illustrations of protection circuits 200, 300, and 400, respectively, used to illustrate the results of a continuous current test, according to exemplary embodiments. In exemplary embodiments, the bi-metallic switch is a KSD-01 Temperature Switch Thermostat (triggers at 60° C. and operating current @ 2 A 250V), the D MOSFET is a IXTH16N50D2 depletion mode MOSFET (with $V_{DSX}$=500V, $I_{D(on)}$=16 A, $R_{DS(on)}$=300 mOhm), and the resistor 206 is a 0 Ohm resistor. In FIG. 2, the bi-metallic switch 202 is a standalone device uncoupled to a MOSFET. In FIG. 3, a bi-metallic switch 302 is connected to a D MOSFET 304 and a resistor 306, with the circuit elements similarly arranged as in the protection circuit 100 of FIG. 1. In FIG. 4, the bi-metallic switch 402 (KSD-01F) is tied to the D MOSFET 404 (T0247 package) in a back-to-back approach with a screw 412 and bolt (not visible). In one embodiment, the bi-metallic switch 402 and D MOSFET 404 are further thermally linked to one another using thermally conductive epoxy adhesive (not shown). In another embodiment, the bi-metallic switch 402 and D MOSFET 404 are further thermally linked to one another using conductive epoxy gel. Further, the bi-metallic switch 402 and the D MOSFET 404 are electrically connected to one another and to other parts of the circuit via wires 406, 408, and 410. The KSD-01F bi-metallic switch consists of a bi-metallic disc, a metal bridge connecting the two legs of the device, a metal bridge contact, and a plastic case which is isolated with a heat sink. The bi-metallic disc will bend at a specific temperature, which makes the metal bridge connect or disconnect the legs, thus closing or opening the circuit.

In FIGS. 2 and 3, respective arrows 204 and 322 show the direction of the current flow. In the circuit 200 featuring the standalone bi-metallic switch 202, current 204 flows from node 206 to node 208 while the switch is closed. When the bi-metallic switch 202 is opened, no current flows. In the circuit 300 featuring the bi-metallic switch 302, D MOSFET 304, and resistor 306, current 322 flows from the node 308, through the closed bi-metallic switch 302, from the node 314 to the node 316 of the D MOSFET 304 (drain-to-source), from the node 318 to the node 320 of the resistor 306, and finally to the node 310. Because the resistor 306 is connected between the source and the gate of the D MOSFET 304, the voltage across the resistor 306 as the current 322 flows is the same as the gate-to-source voltage, $V_{GS}$, of the D MOSFET. Thus, the voltage across the nodes 314 and 316 (in gray) are the drain-to-source voltage, $V_{DS}$, of the D MOSFET 304 while the voltage across the nodes 318 and 320 (in white) are the gate-to-source voltage, $V_{GS}$.

The circuit 300 may also be a standalone device 300 consisting of the bi-metallic switch 302, the D MOSFET 304, and the resistor 306. The overcurrent protection device 300 may thus be added to any circuit needing overcurrent protection.

Overcurrent test currents were conducted to evaluate the trip time of the bi-metallic switch under three sets of conditions:

Test current with 100% (2 A), 200% (4 A), 300% (6 A), 400% (8 A), 500% (10 A), 600% (12 A), 700% (14 A), 800% (16 A), 1000% (20 A), and 1200% (24 A) of applied current (below the saturation current, $I_{sat}$) with the bi-metallic switch 202 as a standalone device (FIG. 2)

Test current with 100% (2 A), 200% (4 A), 300% (6 A), 400% (8 A), 500% (10 A), 600% (12 A), 700% (14 A), 800% (16 A), 1000% (20 A), and 1200% (24 A) of applied current (below the saturation current, $I_{sat}$) with the bi-metallic switch 202 connected to the D MOSFET 204 (FIG. 3)

Test current with 100% (2 A), 200% (4 A), 300% (6 A), 400% (8 A), 500% (10 A), and 600% (12 A)), 700% (14 A), 800% (16 A), 1000% (20 A), and 1200% (24 A) of applied current (below the saturation current, $I_{sat}$) with the bi-metallic switch 202 thermally linked to the D MOSFET 204 using a screw and bolt (FIG. 4)

Because the bi-metallic switch used in these tests, the KSD-01 Temperature Switch Thermostat, has an operating current of 2 A (at 250V), a 2 A input represents 100% of its operating current. These tests are thus conducted to measure the trip time of the bi-metallic switch at various operating conditions. Thus, with the exception of the first test at 2 A, the device is tested at multiples of its normalized current rating, with the most extreme test occurring at twelve times (24 A) the current rating of the device.

Figure 5:
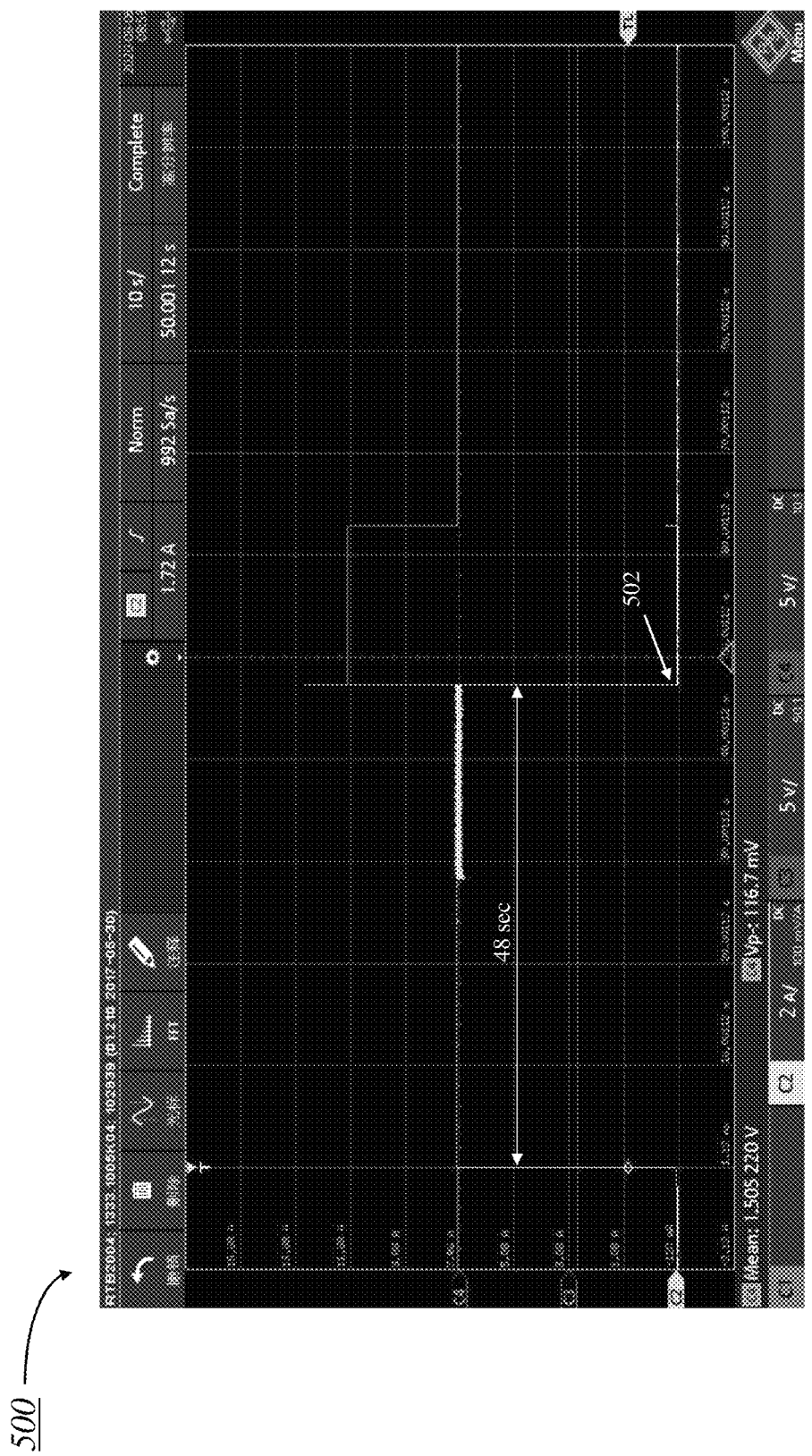
FIG. 5 is a response waveform for an experiment performed with the standalone bi-metallic switch of FIG. 2, in accordance with exemplary embodiments.

FIG. 5 is a response waveform 500 for the standalone bi-metallic switch 202 of FIG. 2, in which a 10V source supplies an 8 A current (400% of the switch's current rating) to the circuit 200, according to exemplary embodiments. Even though the current flowing through the bi-metallic switch 202 is rated at four times the normalized current rating of the device, it still takes 48 seconds to reach the device trip point 502. This is not ideal, as the long time to trip for a bi-metallic switch under four times normalized current will put a very high stress on the downstream components, increasing the likelihood of failure.

Figure 6:
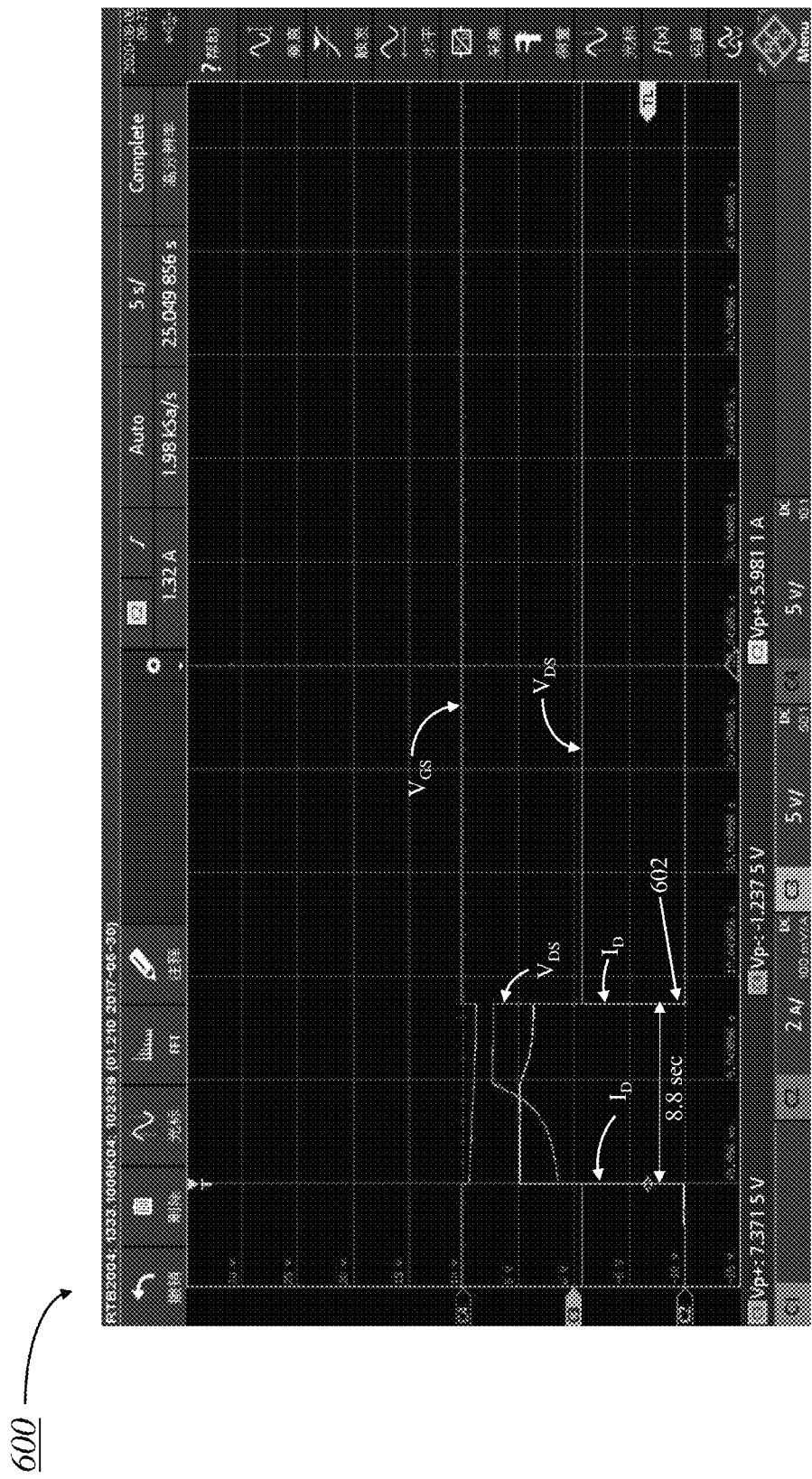
FIGS. 6 and 7 are response waveforms for an experiment performed between the bi-metallic switch and D MOSFET of FIG. 3, in accordance with exemplary embodiments.
Figure 7:
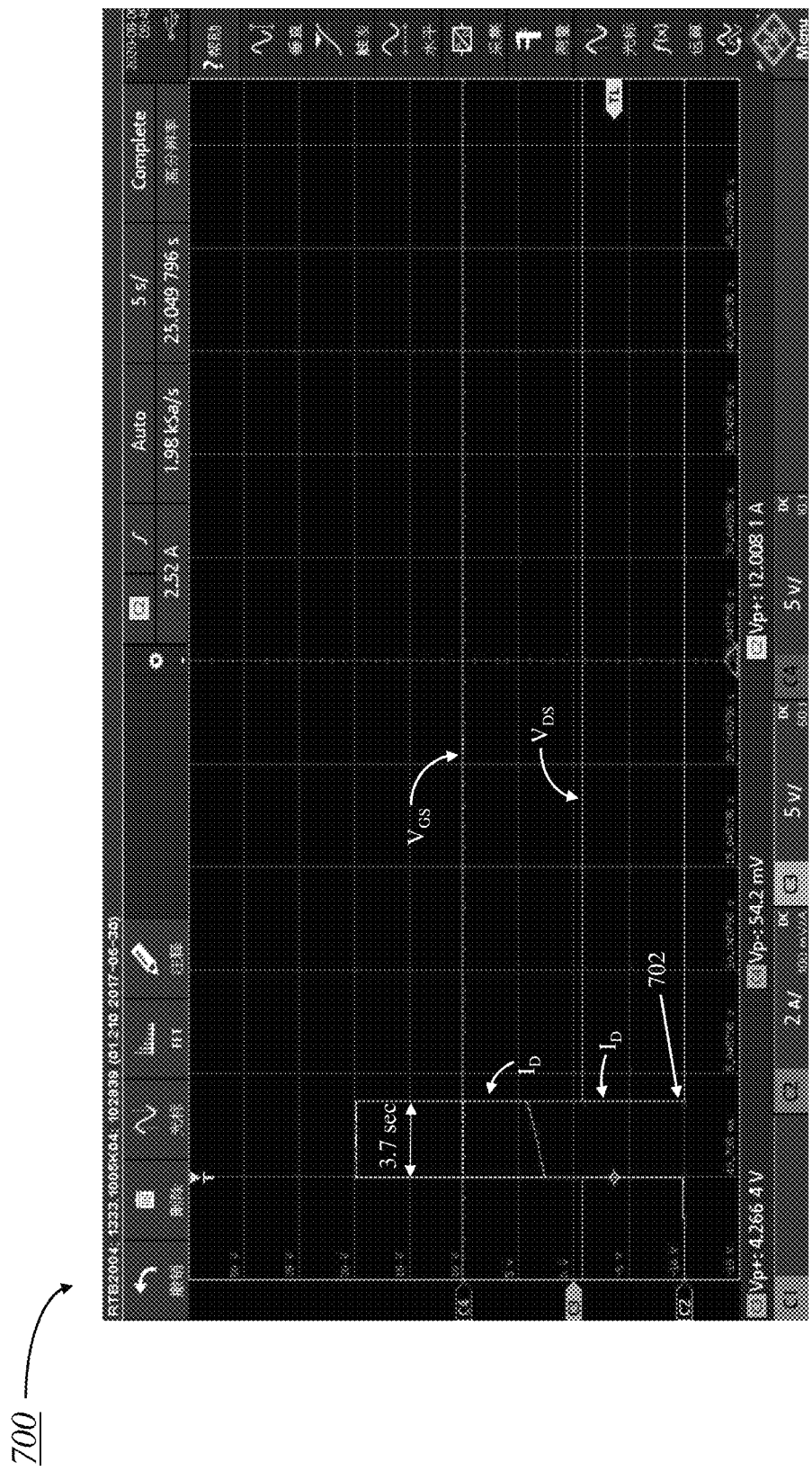

FIG. 6 is a response waveform 600 for the bi-metallic switch 302 connected to the D MOSFET 304 of FIG. 3, in which a 10V source supplies 6 A (300% of the switch's current rating) to the circuit 300, in accordance with exemplary embodiments. As shown in the waveform 600, a 10V 6 A overcurrent condition was applied to the protection circuit 300 (FIG. 3) to measure its response. The current through the D MOSFET 304 ($I_D$) (C2) and the voltage across the bi-metallic switch 302 and the D MOSFET 304 ($V_{DS}$) (C3), were monitored and captured versus a time plot. Their scales are marked at the bottom of the waveform 600. The trip point 602 is the point where the bi-metallic switch 302 was starting to disconnect FIG. 7 is a response waveform 700 for the bi-metallic switch 302 connected to the D MOSFET 304 of FIG. 3, in which a 10V source supplies 12 A (600% of the switch's current rating) to the circuit 300, in accordance with exemplary embodiments. In this example, the resistance 306 is at 0 Ohms. As shown in the waveform 700, a 10V 12 A overcurrent condition was applied to the protection circuit 300 (FIG. 3) to measure its response. At the trip point 702, the current, $I_D$, flowing from the D MOSFET 304 drops quickly from 12 A to 0 A while the voltage across the MOSFET, $V_D S$, drops from 10V to 0V. Right before the trip point 702, the MOSFET 304 takes around 4.27V×12 A=54.24 W of power dissipation (see table 800 of FIG. 8, below). The 600%, 12 A rated current brought about the heat dissipation in the D MOSFET 304, which caused the temperature of the MOSFET packaging to increase and reach a level of disconnection of the bi-metallic switch 202 at 60° C. In the example illustrated in the response waveform 700 (FIG. 7), it took about 3.7 seconds for the trip point 702 of the bi-metallic switch 202 to be reached. Thus, in exemplary embodiments, as illustrated by these waveforms, the response time to cut off the overcurrent event depends not only on the overcurrent magnitude but also the intrinsic heat dissipation caused by the D MOSFET 304.

Figure 8:
FIG. 8 is a table providing results of overcurrent test current operations performed on the circuits of FIGS. 2 and 3, in accordance with exemplary embodiments.

FIG. 8 includes a table 800 to illustrate results of overcurrent test current operations, according to some embodiments. Further tests were conducted with different currents, with and without the presence of the D MOSFET 304, as shown. In these examples, the IXTH16N50D2 D MOSFET and a bi-metallic switch with a 60° C. trigger were tested with rated current below the saturation current, Lat.

Table 800 provides a summary of the tests with different current and bi-metallic switch trip response. The top of the table 800 provides time to trip information for the bi-metallic switch 302 connected to the D MOSFET 304 (FIG. 3) at eight current conditions (6 A, 8 A, 10 A, 12 A, 14 A, 16 A, 20 A and 24 A); the bottom of the table 800 provides time to trip information for the bi-metallic switch 202 without connection to a D MOSFET (FIG. 2), at the same eight current conditions. Table 800 shows that the time to trip of the standalone bi-metallic switch 202 (FIG. 2) is 8 seconds (with 12 A current). With the same 12 A applying to the D MOSFET combined with the bi-metallic switch circuit (FIG. 3), the time to trip shortens to only 3.7 s. Thus, in exemplary embodiments, the time to trip is much faster/improved with 3× to 6× current range for D MOSFET+bi-metallic switch.

Table 800 also shows that the bi-metallic switch does not trip at 2 A (100%) or 4 A (200%) applied current. Instead, the bi-metallic switch starts to trip at 6 A (300%) due to the fact that there is sufficient energy to thermally activate the bi-metallic switch at the 6 A current.

As these experiments illustrate, in exemplary embodiments, the presence of the D MOSFET speeds up the trip of the bi-metallic switch in all current ratios. The resistance, R, determines the maximum allowable current to passing through the D MOSFET in a steady state, which is the $I_{sat}$ saturation current. Using a 0 ohm resistor will allow a high $I_{sat}$ value compared to that using a R=0.1 ohm resistor, in an exemplary embodiment. When the resistor 306 is zero, the $V_{GS}$ of the MOSFET 304 is also zero. But, by increasing the resistance slightly (e.g., R=0.1 ohm), the gate-to-source voltage, $V_{GS}$, of the MOSFET 304 will become slightly negative, and will start to pinch off and limit the current flowing through the D MOSFET.

By increasing the resistance, R, both the saturation current, $I_{sat}$, and the gate-to-source voltage ($V_{GS}$) will change, such that power across the D MOSFET varies and is able to provide more power dissipation to the D MOSFET. In exemplary embodiments, these considerations will facilitate the selection of different bi-metallic switches to work with different ratings of circuit breakers.

Figure 9:
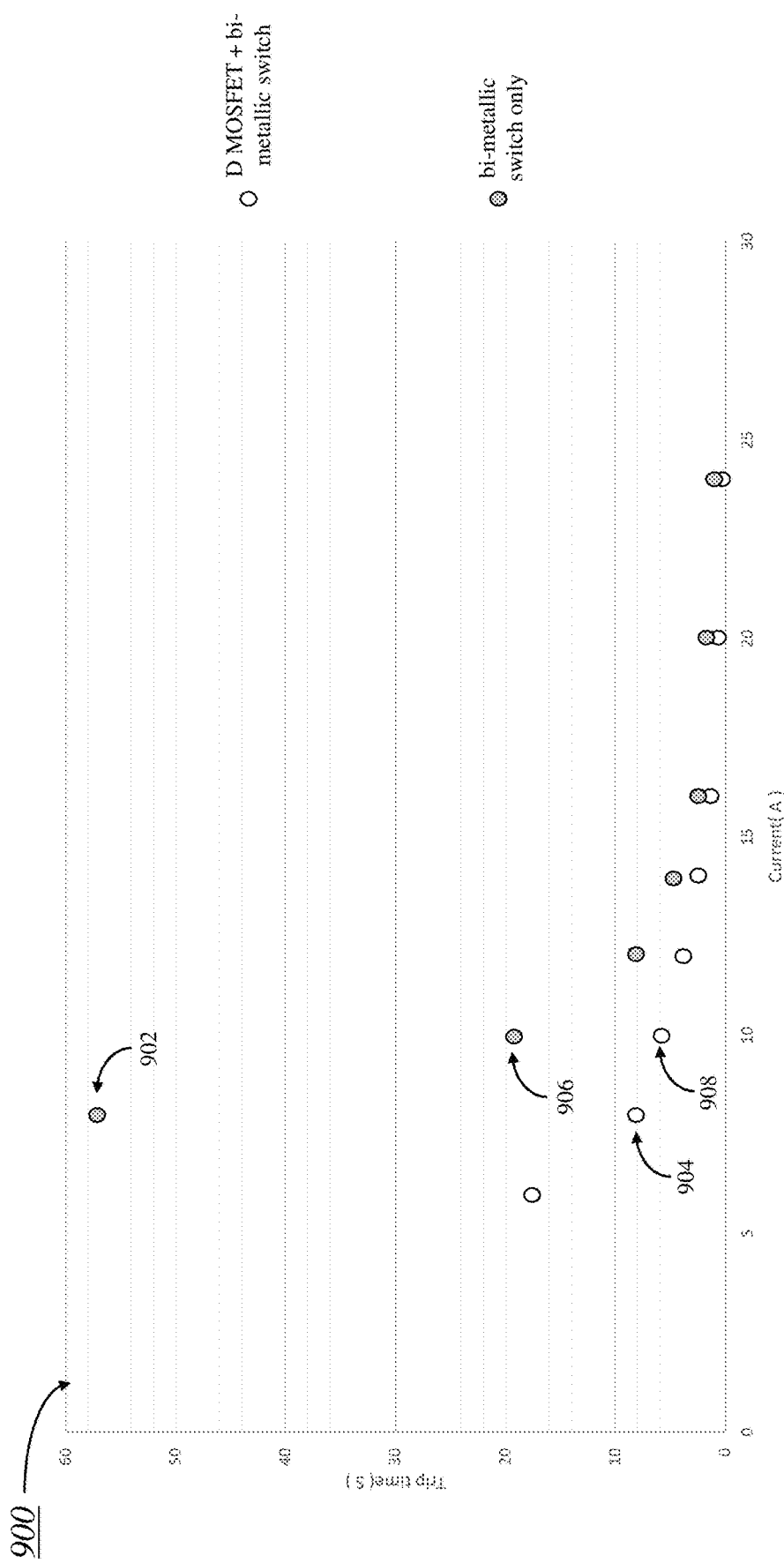
FIG. 9 is a graph comparing trip response time between circuit having a standalone bi-metallic switch versus circuit having a bi-metallic switch with a D MOSFET, in accordance with exemplary embodiments.

FIG. 9 includes a graph 900 which illustrates an improved trip response time of both types of protection circuits: 1) bi-metallic switch with no MOSFET (FIG. 2) and 2) bi-metallic switch with MOSFET (FIG. 3). The graph 900 shows the trip time in seconds (y-axis) versus current in Amps (x-axis) for the bi-metallic switch. The dark circles show trip times for standalone bi-metallic switches (e.g., FIG. 2) while the light circles show trip times for bi-metallic switches plus the D MOSFET (e.g., FIG. 3). Once the bi-metallic switch is combined with the D MOSFET, there is a shift of the trip time from right to left in the graph 900 and from the top down closer to the bottom (meaning shorter time to trip), which is within the safe operating curve of the bi-metallic switch tripping time. Thus, adding a D MOSFET with a bi-metallic switch will enhance the overall time to trip and provide a much faster protection to the downstream electronics.

The benefit provided by the D MOSFET is evident in the graph 900. For example, the time to trip for a standalone bi-metallic switch at 8 A, given by dark circle 902, is about 57 seconds whereas the time to trip for a bi-metallic switch plus D MOSFET at the same current, given by light circle 904, is about 8 seconds. Similarly, the time to trip for the standalone bi-metallic switch at 10 A, given by dark circle 906, is about 19 seconds whereas the time to trip for the combination circuit (light circle 908) is about 6 seconds. Only at the higher currents does the standalone bi-metallic switch compare favorably to the combination circuit, which makes sense because the current rating of the switch has been far exceeded. The graph 900 thus illustrates the benefit of having the combination circuit consisting of both the bi-metallic switch and the D MOSFET working together to protect against overcurrent conditions.

Returning to the protection circuit 200 of FIG. 2, the circuit includes the standalone bi-metallic switch 202 undergoing a surge test, according to exemplary embodiments. The test is performed with a surge current at 1.2/50 μsec, with a peak voltage of 500V at 2 Ohms. FIG. 3, by contrast, shows a circuit 300 with a bi-metallic switch 302 connected to the drain of a D MOSFET 304 and a resistor 306 connected between the source and gate of the MOSFET. One variant of this circuit 300 would include no resistor. Again, the test is performed with a surge current at 1.2/50 μsec, with peak voltage of 500V at 2 Ohms. In both circuits 200 and 300, the bi-metallic switch is a KSD-01 Temperature Switch Thermostat while, in the circuit 300, the D MOSFET 304 is a IXTH16N50D2 depletion mode MOSFET (with $V_{DSX}$=500V, $I_{D(on)}$=16 A, $R_{DS(on)}$=300 mOhm).

Figure 10:
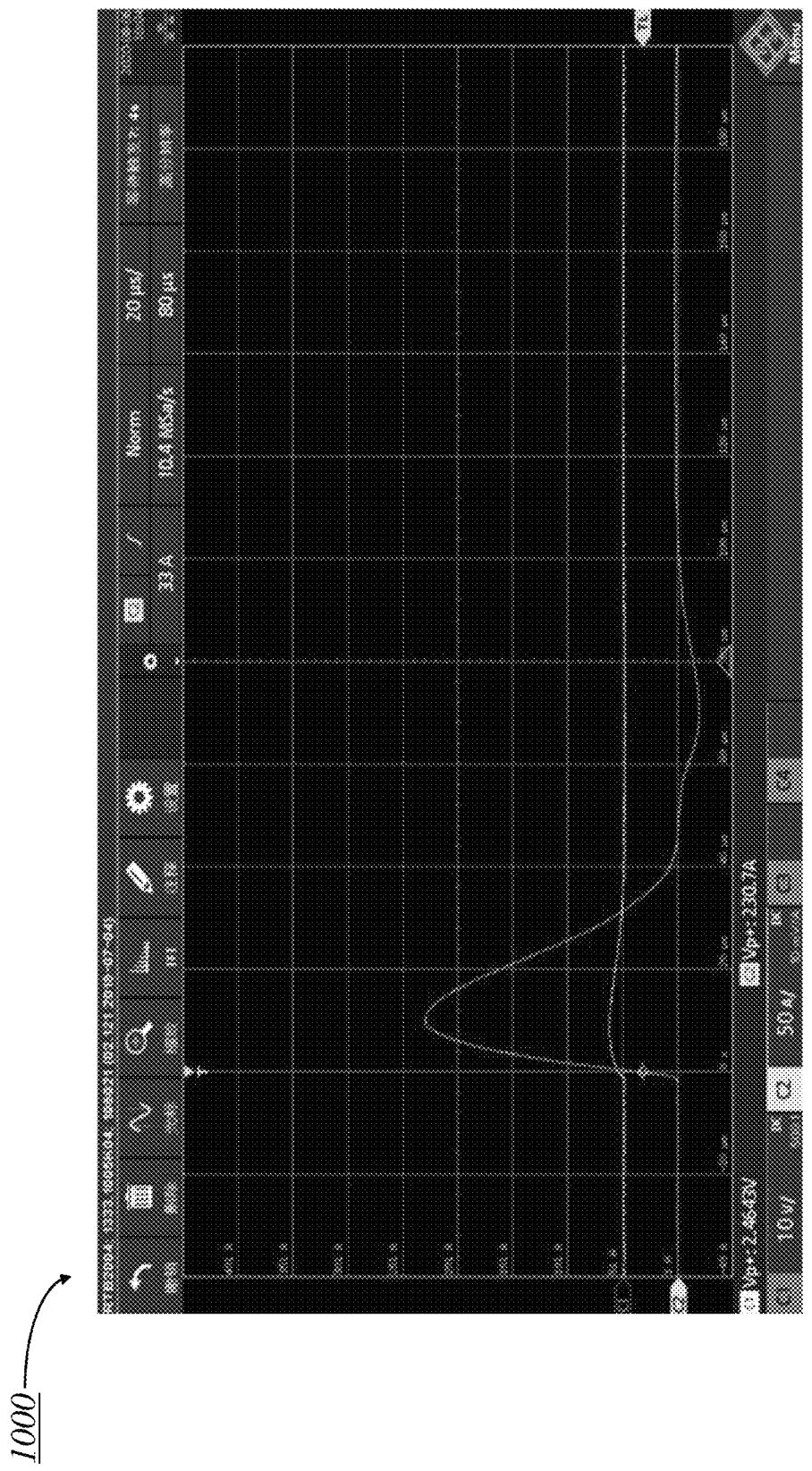
FIG. 10 is a response waveform for an experiment performed on the standalone bi-metallic switch circuit of FIG. 2, in accordance with exemplary embodiments.

FIG. 10 includes a response waveform 1000 which illustrates a surge response for the bi-metallic switch in a standalone circuit, such as the circuit 200 of FIG. 2, according to some embodiments. There is a 1.2/50 μsec surge waveform, with a peak voltage of 500V and 2 Ohms as fictive impedance. As shown in the waveform 1000, the surge current going through the bi-metallic switch (C2) has a response of 230.7 A peak. To transform the voltage waveform, the peak voltage is 230.7 A×2 Ohm=461.4V. The voltage across the bi-metallic switch (C1) stays almost constant at 10V, with some slight rise with the incoming surge. The surge, however, does not trigger the bi-metallic switch to open. Thus, the switch does not trigger with this surge condition, in some embodiments.

Figure 11:
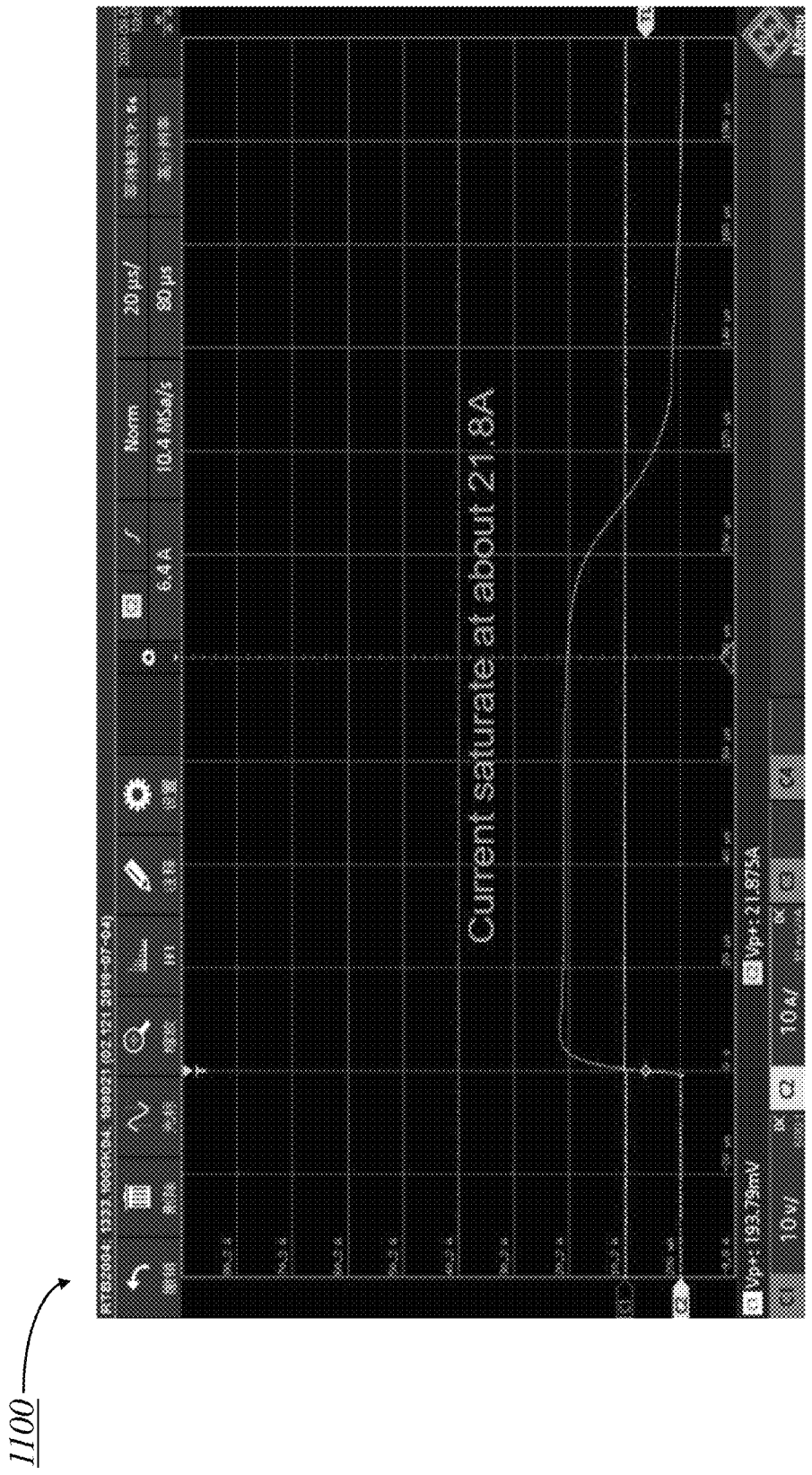
FIG. 11 is a response waveform for an experiment performed on the device including the bi-metallic switch and the D MOSFET of FIG. 3, in accordance with exemplary embodiments.

FIG. 11 includes a response waveform 1100 to illustrate a surge response for a circuit featuring combined D MOSFET and bi-metallic switch, such as the circuit 300 of FIG. 3, according to some embodiments. As shown in the waveform 900, with the same incoming surge condition, the current passing through the D MOSFET and bi-metallic switch combination is clamped down (C2) and stays "saturated" at a peak current of about 21.8 A at around 40 μsec. The D MOSFET clamps very quickly on the surge and causes the resultant output as a very low current output. This contrasts to the above surge test with the standalone bi-metallic switch (FIG. 10).

Thus, in exemplary embodiments, with the deployment of a D MOSFET with a bi-metallic thermal switch, the trigger time of the switch is much faster than when it triggers standalone with the same applied overcurrent. Further, the resultant surge current is at a much lower, safe level, so as to protect downstream circuit elements.

A D MOSFET plus a bi-metallic switch are able to work closely together in a circuit to provide mutual protection, in exemplary embodiments. Under prolonged overcurrent protection events, the D MOSFET heats up and triggers the switch at the specified trigger temperature, and creating the open current, which both prevents an overcurrent from passing through the downstream components of the circuit and protects the D MOSFET from overheating. The switch resets back from its temporarily deformed position to its normal position once its case cools down to a reset level.

Further, in some embodiments, the combination circuit described herein may become part of a manually reset circuit breaker. These types of circuit breakers are known to have bi-metallic strips, but, once the strip is tripped causing an open circuit, the circuit breakers can only be reset with human intervention. The bi-metallic strip plus D MOSFET disclosed herein may be a suitable substitute for such circuit breakers and may eliminate the need for human intervention to reset them. Both devices (the bi-metallic switch and the D MOSFET) have a self-protecting and self-resettable feature together when they connect in this fashion.

In addition to the bi-metallic switch examples given above, the principles described herein may similarly be applied to other types of thermal switches, mini circuit breakers, and relay-type circuit breakers with bi-metallic switches inside, whether these devices include either self-reset or manual reset functions.

From the above test results, the D MOSFET provides an additional heating effect to speed up the trip of the bi-metallic switch. It has been shown that the bi-metallic switch, with the presence of the D MOSFET, is able to trip much faster in all the overcurrent levels, such as 100%, 200%, and 400%, in some embodiments. The bi-metallic switch and the D MOSFET thus work very closely together and provide mutual protection to one another.

In exemplary embodiments, the above waveforms show that putting the bi-metallic switch before the D MOSFET while putting the switch on top of the D MOSFET package together (as illustrated in FIG. 4) causes mutual benefit of the two devices for protecting against overcurrent events. The D MOSFET acts as a current limiter with (or without) the biasing resistor in the gate-to-source terminal of the MOSFET (e.g., the resistor 306 in FIG. 3). When the D MOSFET has a long-term current limiting event, heat generated from its body (packaging) will heat up the bi-metallic switch to cause the switch to open and protect the D MOSFET from overheating (long-term current, $I>I_{sat}$). In exemplary embodiments, the circuit resets back to normal once the temperature drops to the bi-metallic switch restore level. In exemplary embodiments, the D MOSFET also acts as a surge current limiter to clamp external surges to the circuits to be protected.

The principles described herein may be applied to circuits such as miniature circuit breakers (MCBs), as one example. MCBs are used to protect overcurrent events, such as short circuits (e.g., 10 to 100 times normal current), very high surge overcurrent events (e.g., 5 to 10 times normal current), and overload conditions (e.g., 2 to 4 times normal current), such as in buildings including offices and homes. Short circuit refers to overcurrents generated from shorting the power lines or equipment connected to the MCB. The term "overcurrent" includes these short circuit events, but also covers the sudden rise of current caused by external disturbances, such as other high power lines being in contact with the power lines. The MCB is designed to trip or open an internal circuit within the MCB, which shuts off electrical flow and prevents the circuit from overheating. The trip action, which happens very quickly (e.g., under 3 ms), also prevents current from being delivered to the other devices to which the MCB is connected. MCBs also utilize bi-metallic strips, which may be connected to D MOSFETs for improving the response time of the MCB.

The MCBs described herein feature bi-metallic strips, that is, two metal pieces disposed back-to-back, where the two metal pieces are composed of different metals having different coefficients of thermal expansion, causing the bi-metallic strip to bend during heating. In the protection circuit 300 described and illustrated above, the bi-metallic strip is called a bi-metallic switch. This is because, within the circuit, the bi-metallic strip acts as a switch, opening or closing a circuit. In contrast, the bi-metallic switches featured in the below-described MCBs bend to cause a separate circuit component, referred to as a main switch, to open, the main switch being the triggering mechanism for opening the circuit. Although named differently (strip vs. switch), the bi-metallic strips described below are essentially the same as the bi-metallic switch 302 of the protection circuit 300 (FIG. 3), above.

Figure 12B:
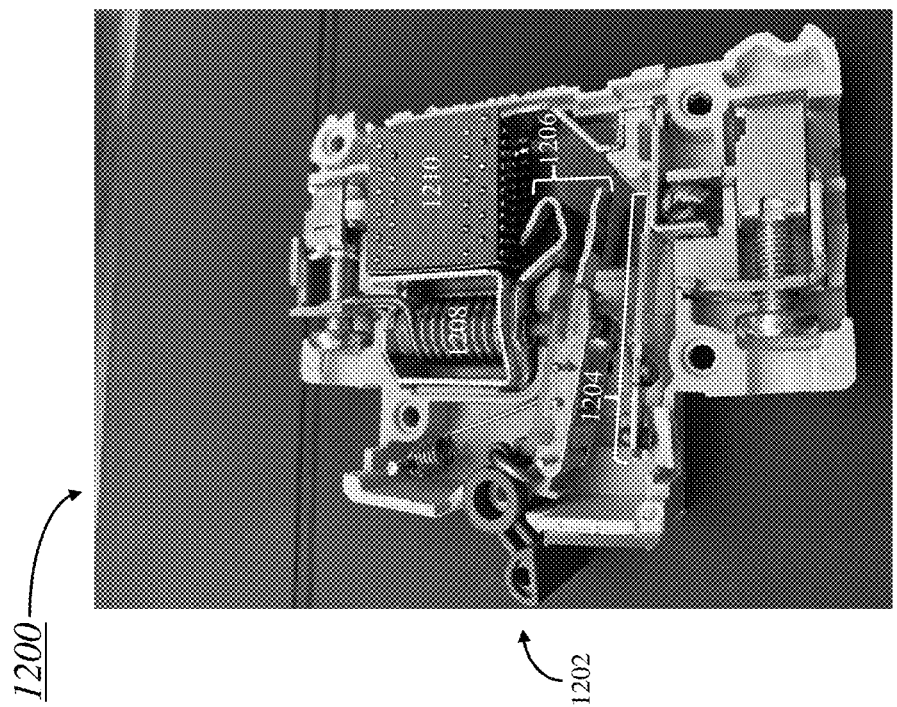
FIGS. 12A and 12B are illustrations of a miniature circuit breaker, in accordance with the prior art.
Figure 12A:
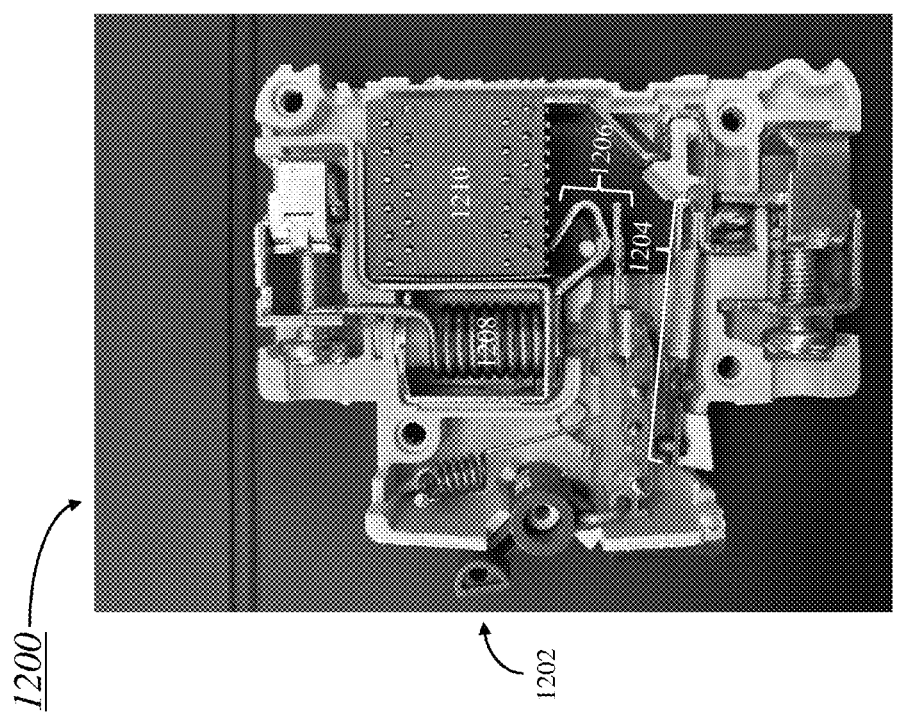

FIGS. 12A and 12B are illustrations of a MCB 1200, according to the prior art. The MCB 1200 is a two-terminal device. The MCB 1200 features a switch to open in response to the short circuit or overload condition. The MCB 1200 features two different sensing elements that activate a triggering mechanism. The first sensing element is a magnetic coil 1208, which has a moving valve. The second sensing element is a bi-metallic strip 1204. The triggering mechanism is a main switch 1206 that is manually controlled by an external lever 1202 and is automatically opened in response to a fault condition. The external lever 1202 turns on the MCB 1200 (closes the main switch 1206, as in FIG. 12A) or turns off the MCB (opens the main switch, as in FIG. 12B). The MCB 1200 also features an arc chute 1210, which is also known as an arc absorber.

The magnetic coil 1208 is an electromagnetic sensor that produces an electric field proportional to the current passing through the coil. A short circuit condition, for which the magnetic coil 1208 is designed, may produce a current up to one thousand times the magnitude of a normal current within milliseconds. As the current gets stronger, the magnetic field around the magnetic coil 1208 gets larger. The moving valve of the magnetic coil 1208 is positioned close to the main switch 1206. As the magnetic field strengthens, the valve pushes against the main switch 1206, causing the switch to open, as in FIG. 12B, resulting in an open circuit. The spring tension of the magnetic coil 1208 is sufficient to not trigger the main switch 1206 to open during normal current flow, but instead during the short circuit condition.

In some cases, when there is a very high surge overcurrent (5 to 10 times the normal current) going into the MCB 1200, the magnetic coil 1208 goes to a saturated state and causes the moveable magnetic valve inside the coil to push to the main switch 1206 very quickly. The fast reaction of the magnetic coil 1208 is critical to cutting off the very hazardous large magnitude of overcurrent and keeping the circuits and systems connected to the MCB 1200 from being damaged.

The other sensor in the MCB 1200 is the bi-metallic strip 1204. The bi-metallic strip 1204 sensor is designed to address overload conditions and is slower acting than the magnetic coil 1208. A slower sensor ensures that appliances that are simply turned on will not trigger the MCB 1200 to shut them down. Fluorescent lights have a startup time of about 10 ms, for example. The bi-metallic strip 1204 causes the MCB 1200 to trip when the overload condition lasts two seconds or more.

As explained above, the bi-metallic strip 1204 consists of two different types of metals, with each metal having a different coefficient of thermal expansion. In an exemplary embodiment, the bi-metallic strip 1204 consists of a first, elongated strip of metal that is wrapped with wire winding as the second strip of metal, with the two metal pieces being connected in series together. When heated up, due to the overload condition occurring, the elongated strip of metal contracts, causing the bi-metallic strip 1204 to bend, which in turn causes movement of the main switch 1206 and opening of the circuit within the MCB 1200. Or, if the bi-metallic strip 1204 is wrapped with wire winding, the wire winding heats up and bends to push the main switch 1206, causing it to open, thus turning off the MCB from external power. The current value at which the bi-metallic strip 1204 should operate can generally be varied within a certain range.

The arc chute 1210 of the MCB 1200 is designed to dissipate the arc current that results when the main switch 1206 opens, whether due to the magnetic coil 1208 or the bi-metallic strip 1204. The arc current flows through the air near the ends of the newly opened main switch 1206, causing a huge temperature rise that can damage the MCB 1200. The arc chute 1210 is therefore disposed above the main switch 1206, as the high-temperature arc current will flow upward. The arc chute 1210 features several parallel metal plates, known as splitters, which are designed to break up the arc current during the upward flow. The metal splitters separate the arc current into smaller arc currents that more quickly dissipate as the arc current continues to flow upward.

Figure 13:
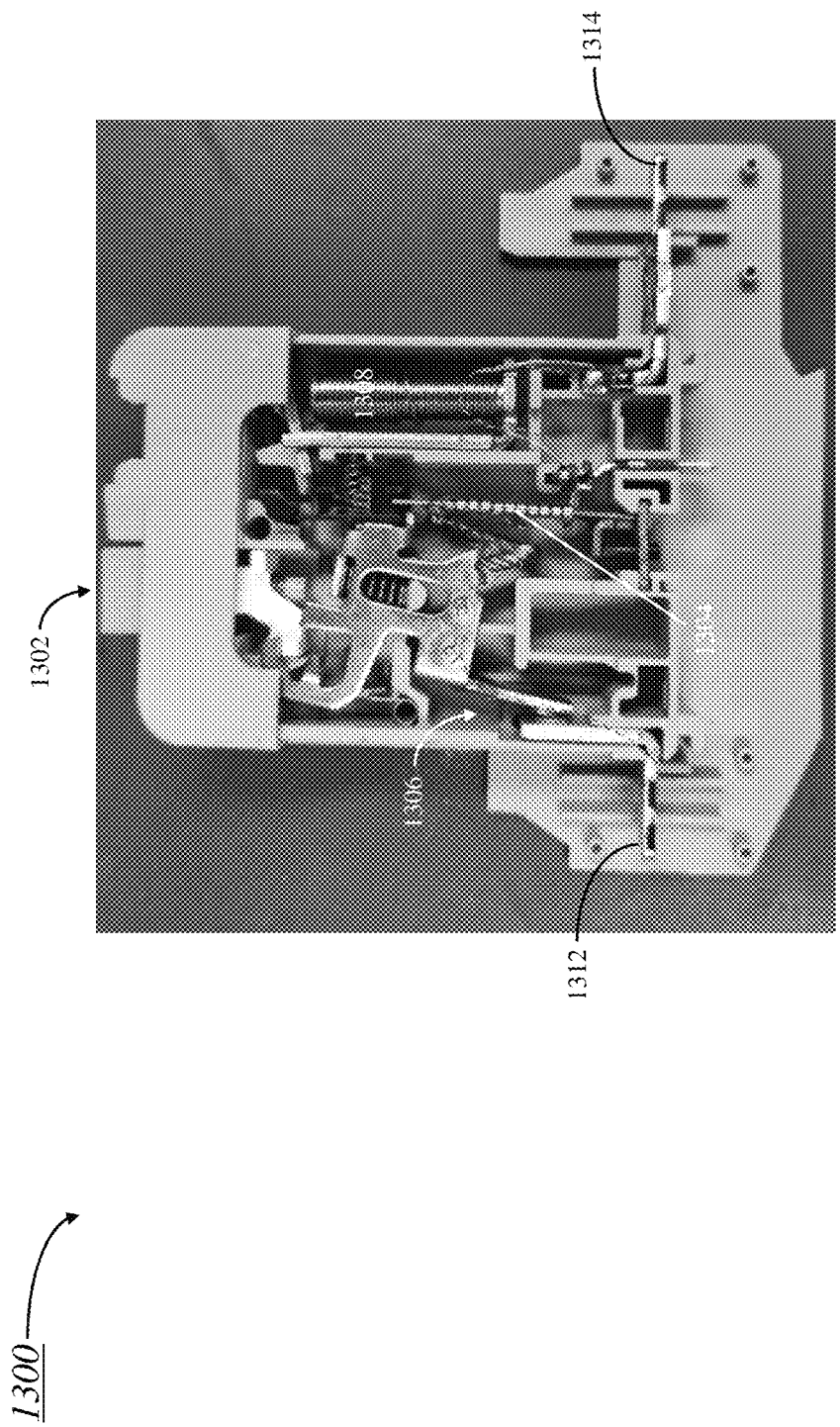
FIG. 13 is an illustration of a miniature circuit breaker, in accordance with the prior art.

FIG. 13 is an illustration of an MCB 1300, according to the prior art. The illustration shows a current path through the MCB 1300. The MCB 1300 includes an external lever 1302 for controlling the main switch 1306, which is the triggering mechanism. As with the MCB 1200, a bi-metallic strip 1304 and a magnetic coil 1308 are the sensor mechanisms of the MCB 1300. A left terminal 1312 and a right terminal 1314 are also shown. The MCB 1300 does not feature an arc chute, as such devices are optional in some circuit breaker designs.

The current path is shown as a dotted line in the MCB 1300. Current travels from the right terminal 1314, through the magnetic coil 1308, also through the bi-metallic strip 1304, then through the main switch 1306, and finally exits via the left terminal 1312. The current also travels in the other direction, from the left terminal 1312, through the main switch 1306, through the bi-metallic strip 1304, through the magnetic coil 1308, and out the right terminal 1314. If the main switch 1306 is open, the current path, in either direction, would be disrupted.

When there is an overcurrent event with magnitude from one to four times the normal current, the overcurrent causes the wire winding wrapping the bi-metallic strip 1304 to heat up and bend, pushing the main switch 1306 until the switch opens, thus turning off the MCB 1300 from external power. When there is a very high surge overcurrent event going into the MCB 1300, the increase in magnetic field causes the movable magnetic valve inside the magnetic coil 1308 to push the main switch 1306 very quickly, enabling the MCB 1300 to thus cut off very hazardous large magnitude of overcurrent.

Figure 14:
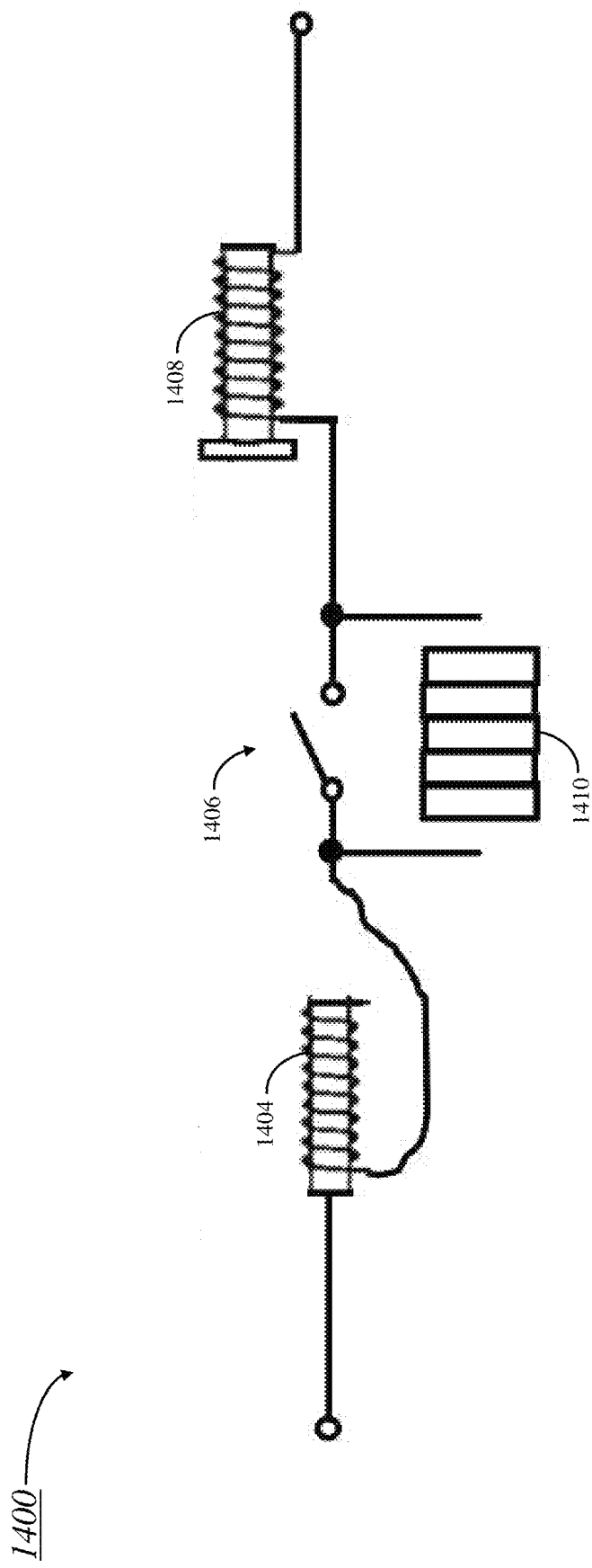
FIG. 14 is a circuit diagram of a miniature circuit breaker, in accordance with the prior art.

FIG. 14 is a circuit diagram 1400 of an MCB, according to the prior art. The circuit diagram 1400 may represent, for example, the MCB 1200 (FIGS. 12A and 12B). A bi-metallic strip 1404 is shown on the left side and a magnetic coil 1408 is shown on the right side of the circuit diagram 1400, with a main switch 1406 being disposed between the two. The bi-metal strip 1404 consists of a first metal that is winded with a second metal, a wire, in series with the first metal. An arc chute 1410 is located near the main switch 1406, so that an arc current can be dissipated following the fault event, whether a short circuit or an overload.

The forces described above, whether from the valve of the magnetic coil 1408 pushing the valve or from the bending of the bi-metallic strip 1404, are what cause the main switch 1406 to be opened, thus disrupting the flow of current. The arc chute 1410 is ready to absorb the excess arc current by diverting the arc to smaller levels inside its metal interface, thus avoiding damage internal to the MCB.

One issue with mini-circuit breakers is with the bi-metallic strip. As explained above, the bi-metallic strip has two different types of metal, each with its own coefficient of thermal expansion. An overcurrent condition causes the bi-metallic strip to bend, opening the circuit. Because it is designed to address overload conditions, the bi-metallic strip is slower acting than the magnetic coil. However, the bi-metallic strip is unable to provide current limiting when the current is above its rated current.

Figure 15B:
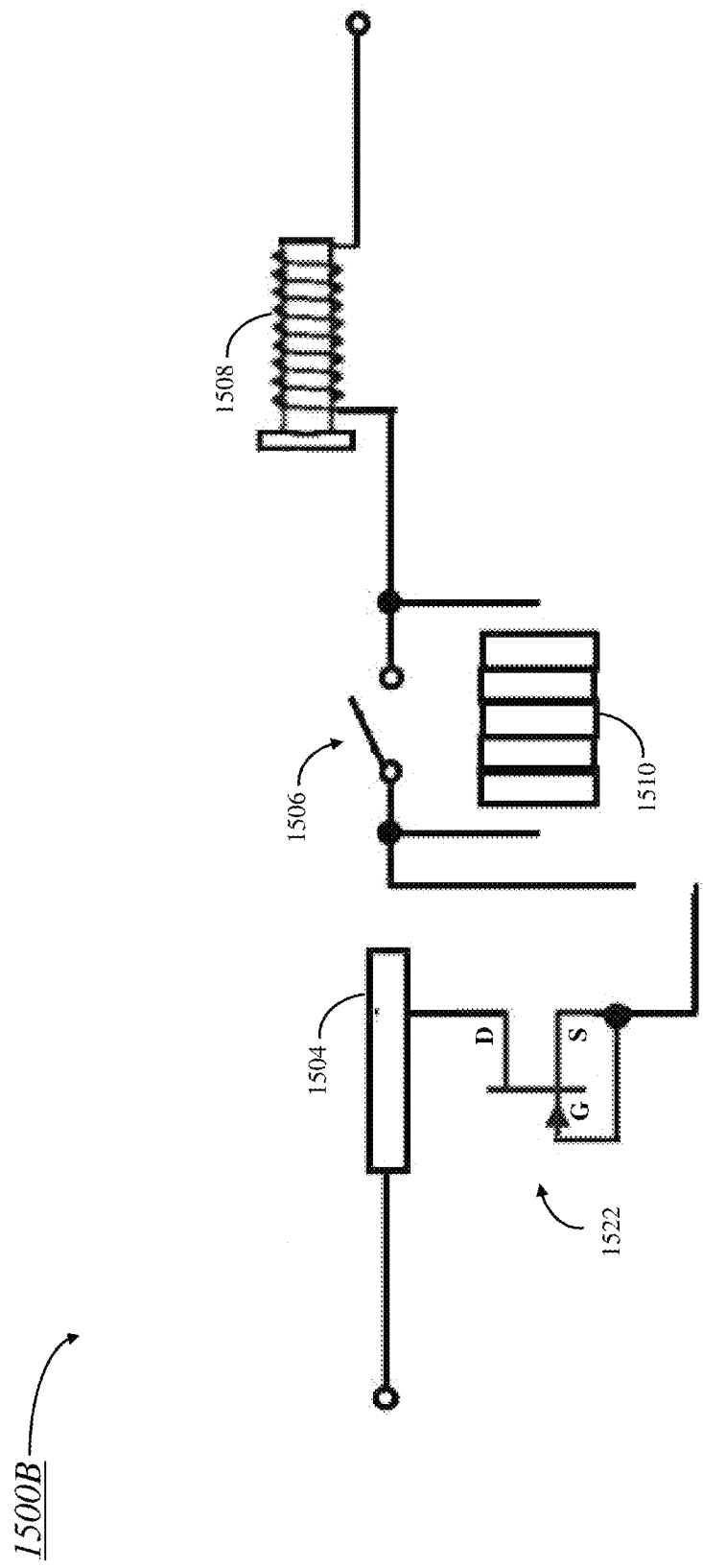

FIGS. 15A and 15B are circuit diagrams 1500A and 1500B, respectively, of an MCB with a D MOSFET, according to exemplary embodiments. In both diagrams 1500A and 1500B (collectively, "circuit diagrams 1500" or "MCB diagrams 1500"), a main switch 1506 is disposed between a bi-metallic strip 1504 on one side and a magnetic coil 1508 on the other side. An arc chute 1510 is located near the main switch 1506 for dissipating arc current. In the circuit diagram 1500A, a D MOSFET 1520 is connected between the bi-metallic strip 1504 and the main switch 1506. In the circuit diagram 1500B, a JFET 1522 is connected between the bi-metallic strip 1504 and the main switch 1506. Thus, either the D MOSFET 1520 or the JFET 1522 may be used to enhance the novel MCB represented by the circuit diagrams 1500.

In an exemplary embodiment, the D MOSFET 1520 is thermally tied to the bi-metallic strip 1504 with the gate G and the source S connected (G-S terminal short), with the D MOSFET being connected in series with the bi-metallic strip (FIG. 15A). In an exemplary embodiment, the JFET 1522 is thermally tied to the bi-metallic strip, also with the gate G and the source S connected (G-S terminal short), with the JFET being connected in series with the bi-metallic strip. In one embodiment, the bi-metallic strip 1504 and D MOSFET 1520 or JFET 1522 are thermally linked to one another using thermally conductive epoxy adhesive. In another embodiment, the bi-metallic strip 1504 and D MOSFET 1520 or JFET 1522 are thermally linked to one another using conductive epoxy gel. In an exemplary embodiment, the bi-metallic strip 1504, in conjunction with either the D MOSFET 1520 or the JFET 1522, is able to provide current limiting when the incoming current is above the current rating of the MCB represented by the circuit diagram 1500.

Like the MOSFETs introduced above, Junction Field Effect Transistors (JFETs) are also semiconductor devices used for switching and amplifying electronic signals in electronic devices. Both JFETs and MOSFETs are voltage-controlled devices. Because JFETs only come in the depletion mode variety, they are on and fully conducting when there is 0V at the gate, as with the depletion mode MOSFETs used herein. Both have high input impedance and are therefore sensitive toward input voltage signals, though MOSFETs are more resistive than JFETs. Further, JFETs are cheaper and less complex to manufacture, while MOSFETs are more fragile, due to the presence of the metal oxide insulator in the MOSFETs.

In an exemplary embodiment, the second metal of the bi-metallic strip 1504, the wire winding, is removed, and the D MOSFET 1520 or the JFET 1522 is attached closely to the bi-metallic strip. In one embodiment, the metal winding is not added back to the elongated metal piece following the attachment of the D MOSFET 1520 or the JFET 1522. The D MOSFET 1520 or JFET 1522 are able to provide heat directly to the bi-metallic strip 1504. Thus, removing the metal winding can help minimize the series resistance and ohmic loss in the power line. In an exemplary embodiment, the JFET 1522 is a silicon carbide (SiC) JFET is connected between the bi-metallic strip 1504 and the main switch 1506.

In an exemplary embodiment, the D MOSFET 1520 or the JFET 1522 enters the current limiting mode if current more than the current rating of the MCB represented by the circuit diagram 1500 is received into the MCB. Thus, for example, if the MCB of the circuit diagram 1500 has a current rating of 1 A, the D MOSFET 1520 or JFET 1522 enters the current limiting mode if current greater than 1 A is received into the MCB. Although the external overcurrent may reach up to 5 A, the D MOSFET 1520 or the JFET 1522, in conjunction with the bi-metallic strip 1204, helps to quickly "clamp" down the current to 1 A (the safe operating level for the MCB). Thus, in exemplary embodiments, the MCB represented by the circuit diagram 1500 is made safe by having the bi-metallic strip 1504 be able to respond to the 5 A overcurrent directly, with the assistance of the FET (whether D MOSFET 1520 or JFET 1522). Otherwise, the 5 A overcurrent may destroy the electronics to be protected by the MCB or the MCB itself.

Figure 16:
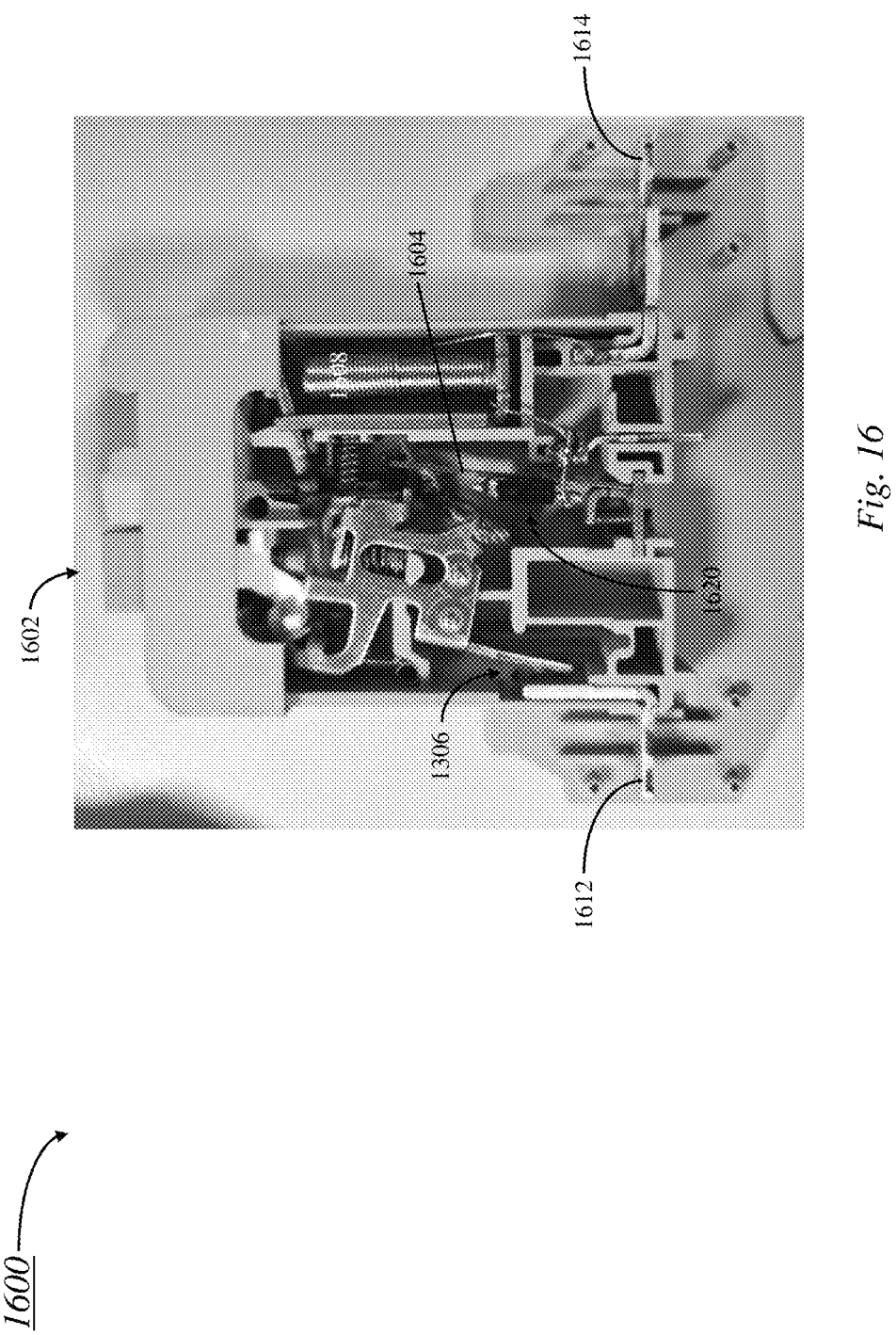
FIG. 16 is an illustration of a miniature circuit breaker with a D MOSFET, in accordance with exemplary embodiments.

FIG. 16 is an illustration of an MCB 1600 which includes a D MOSFET 1620, according to exemplary embodiments. An external lever 1602 manually activates the main switch 1606 triggering mechanism to be either on (closed) or off (open). As in the other MCBs described herein, a magnetic coil 1608 is designed to trip the main switch 1606 in response to a short circuit, and a bi-metallic strip 1604 is designed to trip the main switch in response to an overload condition. Left terminal 1612 and right terminal 1614 connect the MCB 1600 between a load and power source (not shown). In an exemplary embodiment, the D MOSFET 1620 is thermally tied to the bi-metallic strip 1604 with a G-S terminal short, with the D MOSFET being connected in series with the bi-metallic strip. In an exemplary embodiment, the D MOSFET 1620 is tightly affixed to the bi-metallic strip 1604 with the winding wire and heat insulating tube of the bi-metallic strip being first removed before affixation of the D MOSFET.

Figure 17:
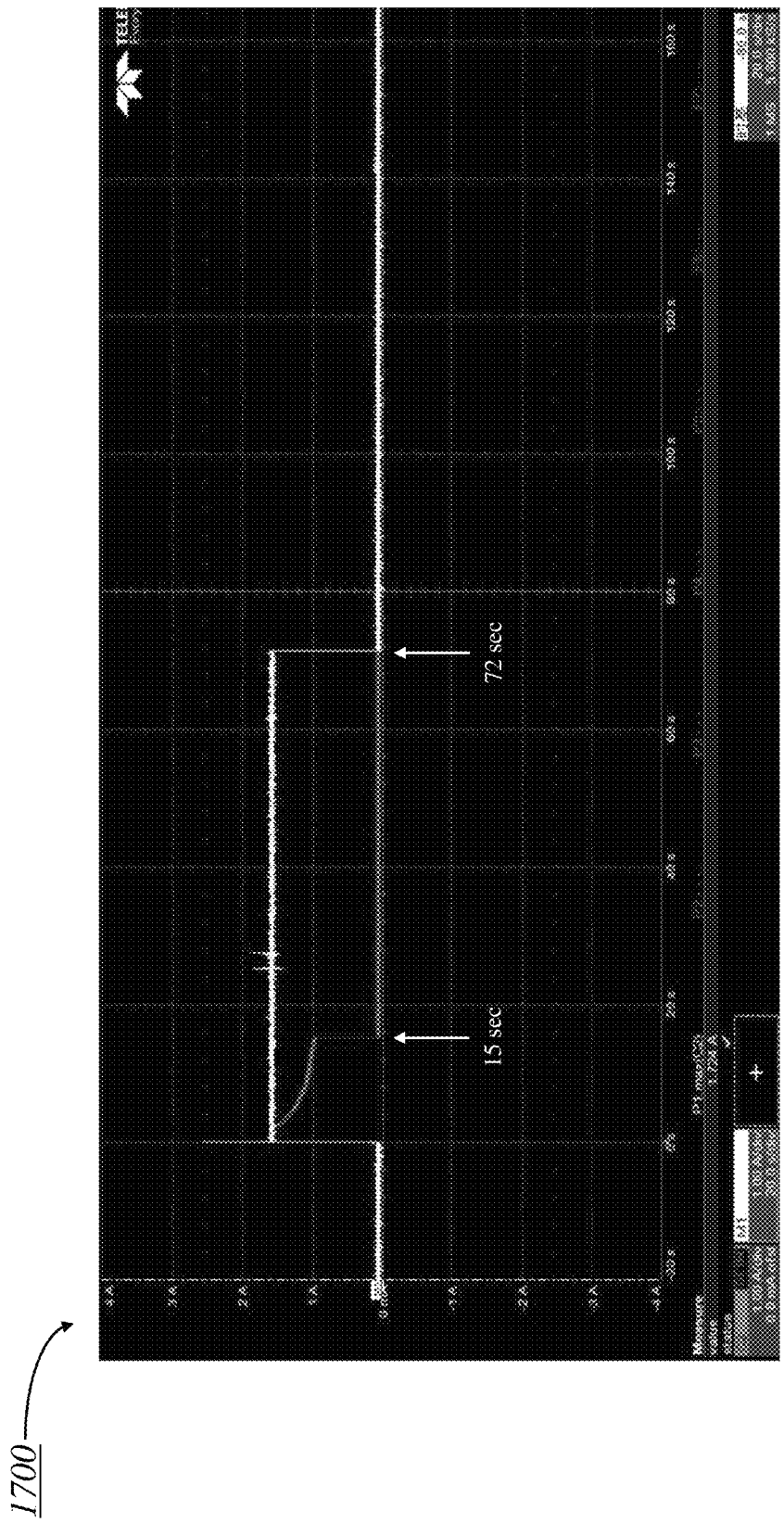
FIGS. 17-19 are response waveforms for experiments performed on a miniature circuit breaker with and without the D MOSFET, in accordance with exemplary embodiments.
Figure 18:
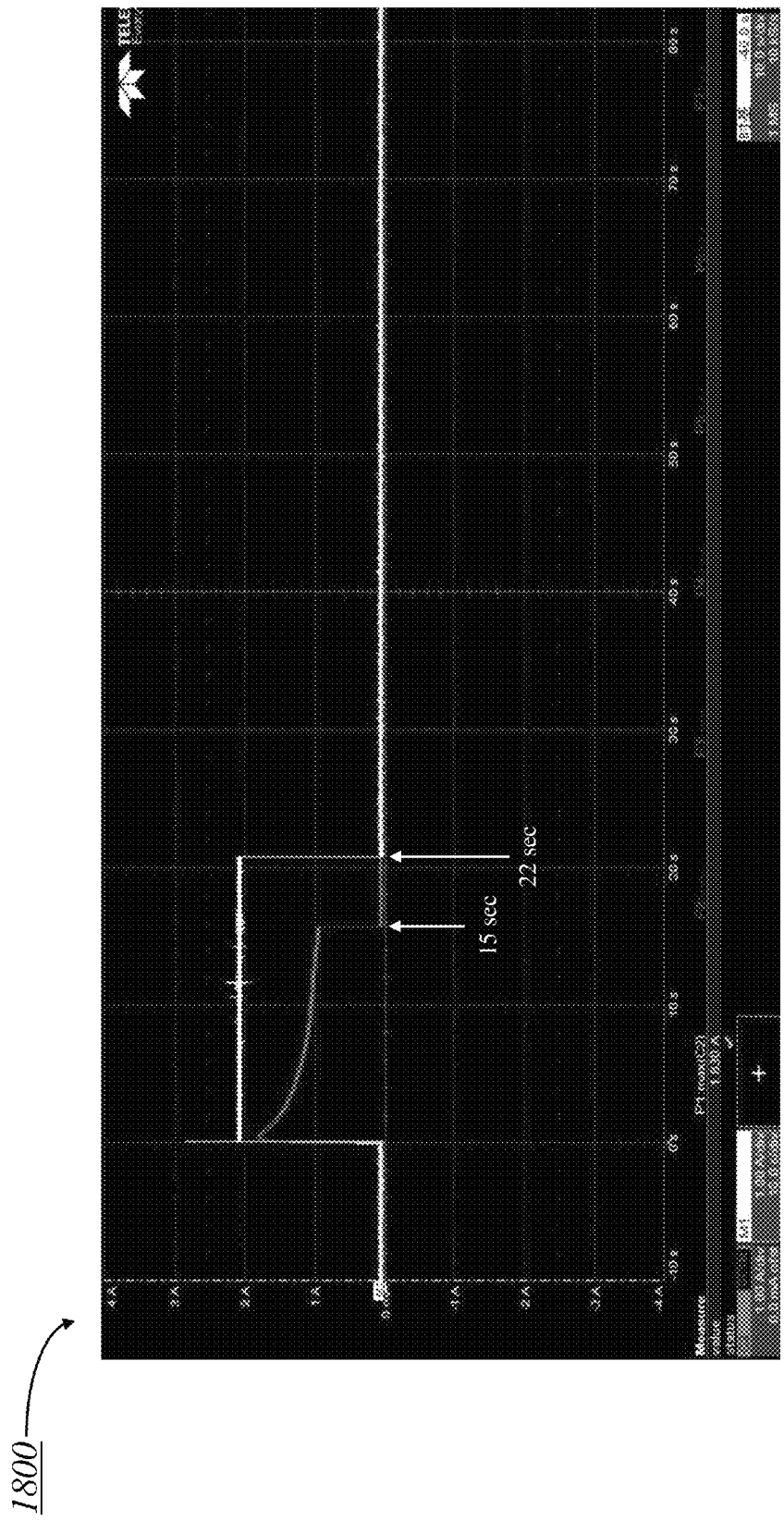
Figure 19:
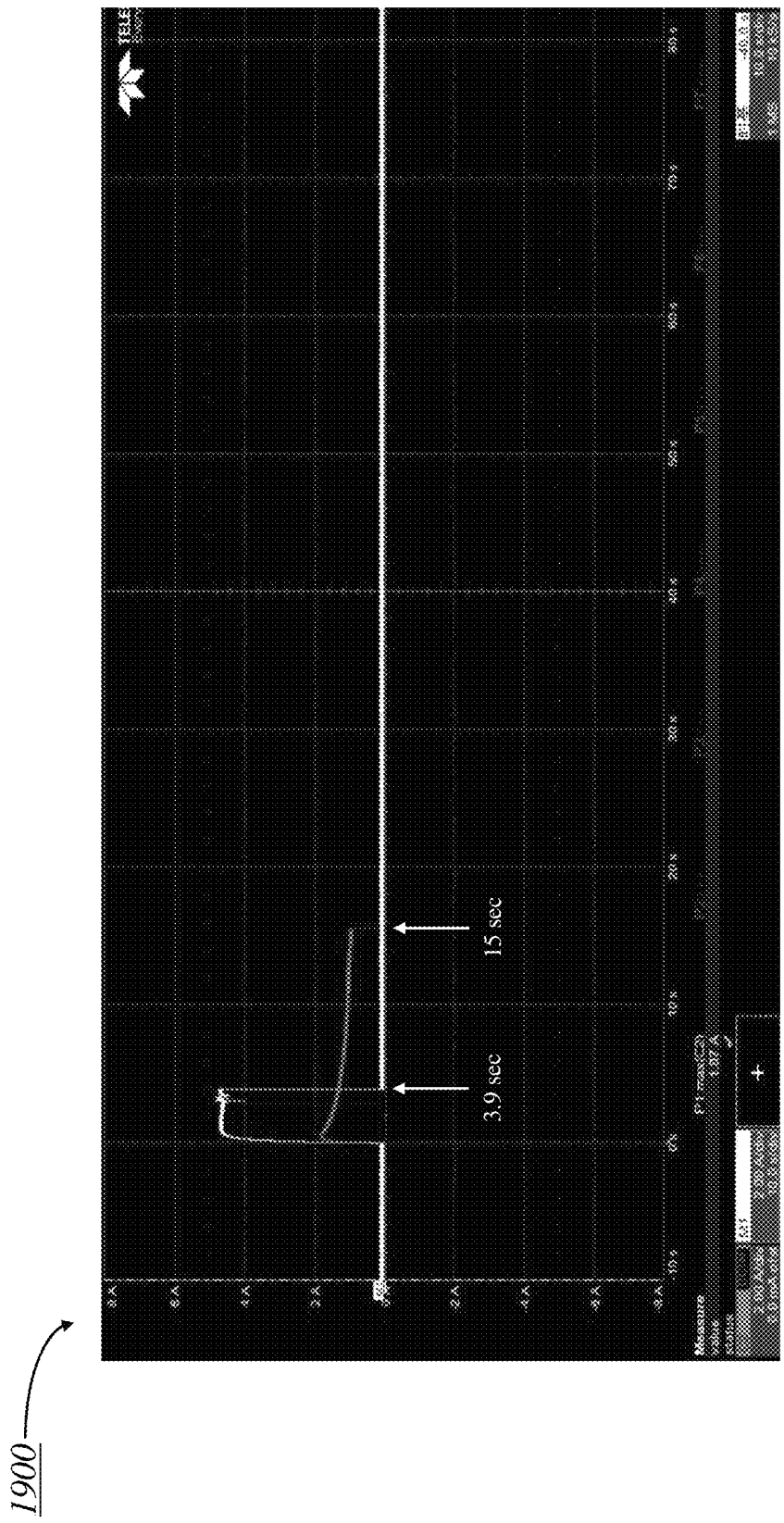

FIGS. 17-19 are response waveforms for experiments performed on an MCB with and without a D MOSFET connected to a bi-metallic strip, according to exemplary embodiments. For the experiments, a Phoenix Contact UT6-TMC 1 A MCB (hereinafter, "PC MCB") is used (manufactured by Phoenix Contact) and a Littelfuse IXTY1R6N50D2 D MOSFET device (hereinafter, "LF DMOS"), with a trip current, Tc, of 165° C., is connected to the bi-metallic strip within the MCB. The LF DMOS is a small package that can fit into the PC MCB.

The response waveform 1700 (FIG. 17) results when an overcurrent of 1.5 A (1.5 times normal current) is invoked. The PC MCB without the LF DMOS tripped after 72 seconds while the PC MCB with the LF DMOS tripped after 15 seconds. Thus, the PC MCB tripped faster with the LF DMOS than without the LF DMOS.

The response waveform 1800 (FIG. 18) results when an overcurrent of 2.0 A (twice the normal current) is invoked. The PC MCB without the LF DMOS tripped after 22 seconds while the PC MCB with the LF DMOS tripped after 15 seconds. Thus, the PC MCB tripped faster with the LF DMOS than without the LF DMOS.

The response waveform 1900 (FIG. 19) results when an overcurrent of 5 A (5 times normal current) is invoked. The PC MCB without the LF DMOS tripped after 3.9 seconds while the PC MCB with the LF DMOS tripped after 15 seconds. Thus, the PC MCB tripped slower with the LF DMOS than without the LF DMOS. Further, for each experiment conducted (1.5 A, 2 A, and 5 A), the PC MCB with the LF DMOS tripped after 15 seconds.

The result of these experiments shows that the addition of a D MOSFET to the bi-metallic strip helps to limit the overcurrent to 1 A eventually, no matter how high the external overcurrent is. The addition of the D MOSFET has altered the time-to-trip response time curve. The response waveforms show that the bi-metallic strip can trip and protect the LF DMOS safely even when the current exceeds a current rating of the MCB. The combined effect of the LF DMOS with the bi-metallic strip makes the combined circuit a current limiting self-protecting switch, which a standalone bi-metallic strip cannot perform.

Thus, rather than having a simple bi-metallic strip temperature sensing structure, the presence of the FET (D MOSFET or JFET) connected to the bi-metallic strip forms a current limiting, surge tolerant, and cut-off overcurrent protection switch. Further, the bi-metallic strip acquires sufficient heat dissipation from the FET during current limiting to trigger the main switch of the MCB, resulting in an open circuit, thus protecting the FET from overheating or chip failure.

In exemplary embodiments, the LF DMOS is an epoxy packaged D MOSFET attached to the bi-metallic strip. In other embodiments, a bare D MOSFET die or a bare D MOSFET die attached to a metal plate with a suitable lead frame is used to ensure better thermal propagation to trigger the bi-metallic strip. The data from the experiments of FIGS. 17-19 are derived from DC operating conditions. When used in AC operating conditions, in some embodiments, two back-to-back D MOSFETs are connected to the bi-metallic strip.

The addition of the FET (D MOSFET or JFET) to the MCB is an extension of combining the D MOSFET to the bi-metallic switch 302 in the protection circuit 300 (FIG. 3). The MCB, such as is represented by the circuit diagram 1500 (FIG. 15), has a similar but more complicated structure than the protection circuit 300. The addition of the FET to the MCB advantageously provides current limiting, surge protection, and overcurrent protection. The bi-metallic strip connected with the FET causes the main switch of the MCB to open safely, which helps to provide a safe power cutoff during external hazardous overcurrent events. The FET is thus an efficient way to improve cut-off speed, thus providing a safer protection option for electrical system designers.

In exemplary embodiments, the D MOSFET connected to the bi-metallic strip within the MCB device is further provided with proper driver circuitry to ensure an appropriate turn-off and turn-on time, as well as other functions to drive the D MOSFET.

In additional embodiments of the disclosure, a current limiting protection circuit is provided as part of a miniature circuit breaker. In these additional embodiments, in addition to a bimetallic switch, circuitry is provided that automatically limits the maximum current passing through a line to be protected, such as a load line. FIG. 20 depicts a diagram illustrating a protection circuit including a bi-metallic switch and a D MOSFET, in accordance with exemplary embodiments. FIG. 21 depicts details of a variant of the protection circuit of FIG. 20. As shown in FIG. 20, the protection circuit 2000 may include a bi-metallic switch 2004 having an input side and an output side to coupled along an input path to a load. The bimetallic switch 2004 may be formed with a bimetallic strip, as described in the previous embodiments. The protection circuit 200 may also include a depletion mode transistor, in particular, a depletion mode field effect transistor (D MOSFET) 2002 that is connected in series with and thermally tied to the bimetallic switch 2004. the D MOSFET 2002 has a source terminal, coupled to the ground path (gnd), and a gate terminal, coupled an internal control circuit 2006, where operation of the internal control circuit 2006 is detailed below.

In brief, the protection circuit 2000 operates in three different modes or phases to regulate the level of current flowing to an external component, device, or system to be protected as exemplified by the load 2010. In a first mode, the nominal operation mode, the electrical current flowing through the load 2010 between the input path Vin and ground path Gnd has a value that is below a threshold value, which value may be a preset level established in the internal control circuit 2006. Under these conditions, the internal control circuit 2006 will determine that the electrical current level is below this threshold and may not otherwise regulate the level of the electric current passing through the load

2010. The internal control circuit 200 may also output a signal indicating normal operation, such as from a light emitting diode (LED).

In a second mode, when a current increase or surge takes place, such that the value of electrical current reaches a threshold value, the internal control circuit 2006 will act to limit the current by placing the D MOSFET 2002 into a low saturation mode where the current passing through the load 2010 is limited to a saturation current value inherent in the D MOSFET 2002.

In a third mode, the protection circuit 2000 acts to create an open circuit when an overcurrent conditions persists. In particular, the D MOSFET 2002 acts as a heat source to generate sufficient heat to cause the bimetallic switch 2004 to reach a trip temperature and to open when the overcurrent condition persists. In some embodiments of an automatically resetting switch, the bimetallic switch 2004 may automatically close and restore the protection circuit 200 to a normal mode when the overcurrent condition passes and the heat from the D MOSFET is sufficiently dissipated to cool the bimetallic switch 2004 below a trip temperature.

Turning now to FIG. 21, there are shown details of a variant of the protection circuit 2000. In this variant, the internal control circuit 2006 includes a TVS diode D1, coupled between the input path and the ground path, a switching MOSFET, shown as Q1, having a drain terminal coupled to the ground path, and an Op amp comparator COM, coupled to a drain terminal of the D MOSFET 2002, which component is labeled as Q2.

As shown in FIG. 21, the anode of the TVS diode D1 is coupled to the ground path, while the cathode is coupled to the input 2 of the OP amp comparator COM. The TVS diode D1 is in place to prevent a voltage greater than a predetermined value, such as 10V across the input 2. In addition, the drain terminal of the switching MOSFET Q1 is coupled to the gate terminal of the D MOSFET Q2. For convenience, in various embodiments the various components of the internal control circuit 2006 may be arranged on a printed circuit board.

As further depicted in FIG. 21, a first light emitting diode may be provided, shown as D3, and having an anode coupled to the gate terminal of the D MOSFET Q2. In addition, a second light emitting diode, shown as D2, is provided in the embodiment of FIG. 21, and having an anode coupled to an output side of the OP amp comparator COM.

The embodiment of FIG. 21 of the protection circuit 2000 may act as follows: During normal operation, electrical current will pass from point C through the bimetallic switch 2004 to the D MOSFET Q2 at point B. The current value of the electrical current is determined when the electrical current passes from point A to point B through the resistor RL1, which resistor transforms the current to a voltage level that is fed to the plus input of OP amp comparator COM. The OP amp comparator COM will then compare the current level of the electrical current (actually a voltage value) to a present level (again a voltage) that is set by a resistor network, formed from resistor R5 and resistor R6.

Under normal operating conditions when the current level passing through from point A to point B corresponds to a value below the preset level, the D MOSFET Q2 is set with a relatively higher voltage bias, for example, greater than 8V. This bias level minimizes the $R_{DS(on)}$ level of Q2, meaning the drain-source on resistance," or the total resistance between the drain and source when Q2 is on, Thus, a low ohmic dissipation takes place under this normal operating condition. In addition, under the relatively higher voltage bias, the first LED D3 will be biased to be in an on condition, so as to emit an output signal, such as green light, indicating normal operation.

When an overcurrent condition occurs, the protection circuit 200 will enter a second mode of operation. The current value of the overcurrent will be determined as the voltage level at point B, after passing through the resistor RL1. This voltage level is fed to the positive input of the OP amp comparator COM as a value that now reaches or exceeds the preset value at the negative input of the OP amp comparator COM. Under this condition, the Op-amp comparator COM then outputs a high signal, which signal is directed to the switching transistor Q1 when the overcurrent condition occurs. The high signal is received at Q1 as a voltage that cause the switching transistor Q1 to generate a short circuit across the depletion mode transistor, meaning D MOSFET Q2. In particular, the voltage generated by the high signal causes the gate of Q1 to turn Q2 on and therefore create a direct current path between the gate of Q2 and the source of Q2. Under this short circuit condition, the D MOSFET Q2 enters into a low bias saturation mode, causing the protection circuit 2000 to act as a current limiting mode. Said differently, when the high signal is output under an overcurrent condition, the internal control circuit 2006 automatically places Q1 in a zero voltage bias state where a gate to source voltage $V_{gs}$ is approximately zero volts. As such, the D MOSFET Q2 acts as a current limiter to limit the electrical current passing through the protection circuit 200 and thus through the load 2010, to a maximum value corresponding to a saturation current (Isat) of the D MOSFET Q2.

At the same time, the high signal, output by COM, will represent a voltage sufficient to automatically turn on the second LED, shown as D2, where D2 may be a red LED whose light serves as a warning of an overcurrent condition. Moreover, the turning on of Q1 will also generate a short circuit condition for D3, turning off the green light emitted therefrom. Under circumstances where an overcurrent condition persists sufficiently long, the saturation level current passing through D MOSFET Q2 may be sufficient to significantly heat D MOSFET Q2. This heat may be transmitted from D MOSFET Q2 through the thermal link to bimetallic switch 2004, and may cause the bimetallic switch 2004 to reach a trigger temperature where the bimetallic switch 2004 opens, thus causing the electrical current to cease flowing through the protection circuit 2000. Note that the thermal propagation between D MOSFET Q2 and bimetallic switch 2004 is important as this thermal propagation will affect the results (trip time, IDS, max allowable current, and so forth.

According to various embodiments, after the bimetallic switch opens during the extended overcurrent condition, the protection circuit 2000 will recover once the temperature of the bimetal material of bimetallic switch 2004 drops to a self-reset level. The bimetallic switch 2004 thus ensures the D MOSFET Q2 operates under its SOA safe operating area.

According to a non-limiting embodiments of the disclosure, the D MOSFET Q2 may be a Littelfuse IXTH16N10D2 (16 A, 100V, TO-247); the Bimetallic switch—KSD301 (16 A, 100 deg C.); Op-amp comparator COM—LM393; Switching transistor Q1—2N7002; and TVS diode—Littelfuse P4SMA10 A.

Figure 22:
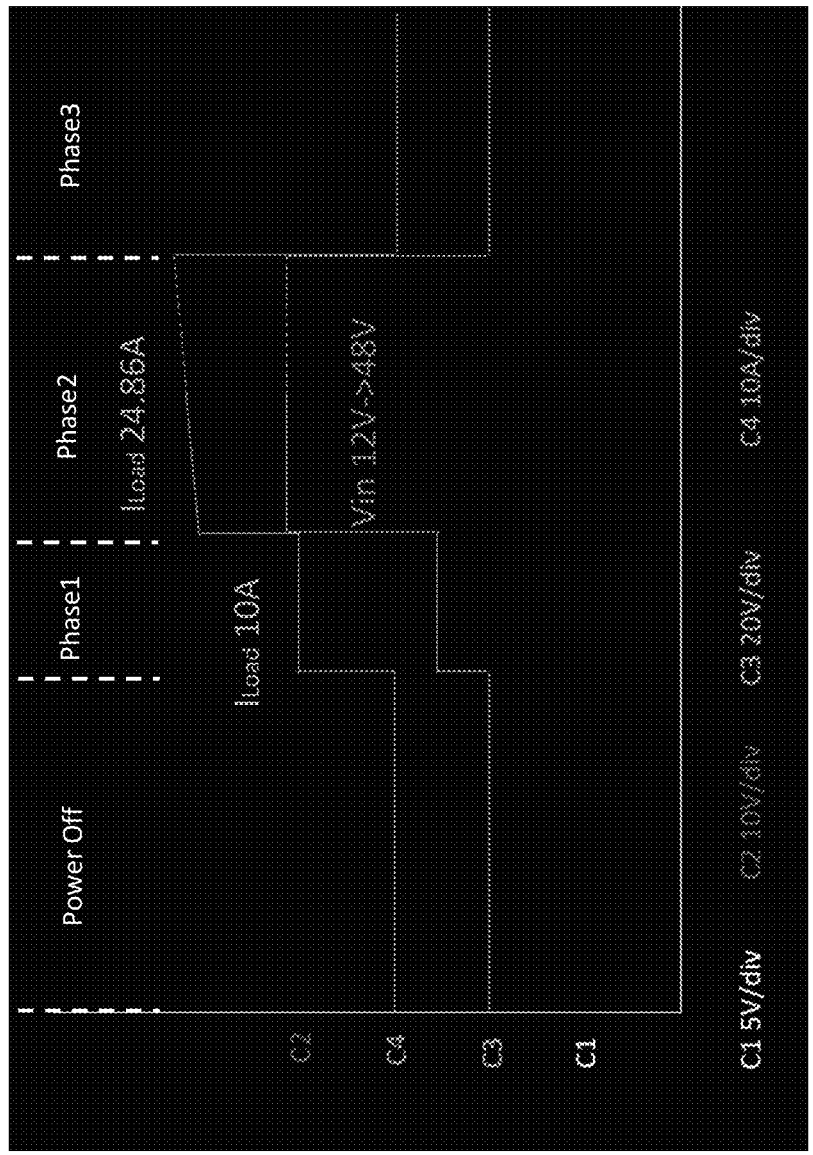
FIG. 22 depicts the voltage behavior of the protection circuit of FIG. 20 under one event scenario.

FIGS. 22-25 to follow depict different operation scenarios of the protection circuit 2000, illustrating further the principles of current limiting provided according to the present embodiments. In FIG. 22, there is shown a case 1, where during an initial interval the power is off as shown. In the phase 1 period, during normal operation mode, the load current is 10 A and voltage Vin is 24V. A sudden surge to 48 V causes the transition to phase 2 period, where current is limited to 24.86 A. During this period, the D MOSFET Q2 will generate heat, by dissipating a power of 1.75 W. The bimetallic switch 2004 may dissipate 1.06 W for a total of 2.86 W, leading to a heating of the bimetallic switch 2004, at the time marked by the beginning of phase 3, where the bimetallic switch 2004 opens, resulting in cessation of current through the protection circuit 2000, as shown.

Figure 23:
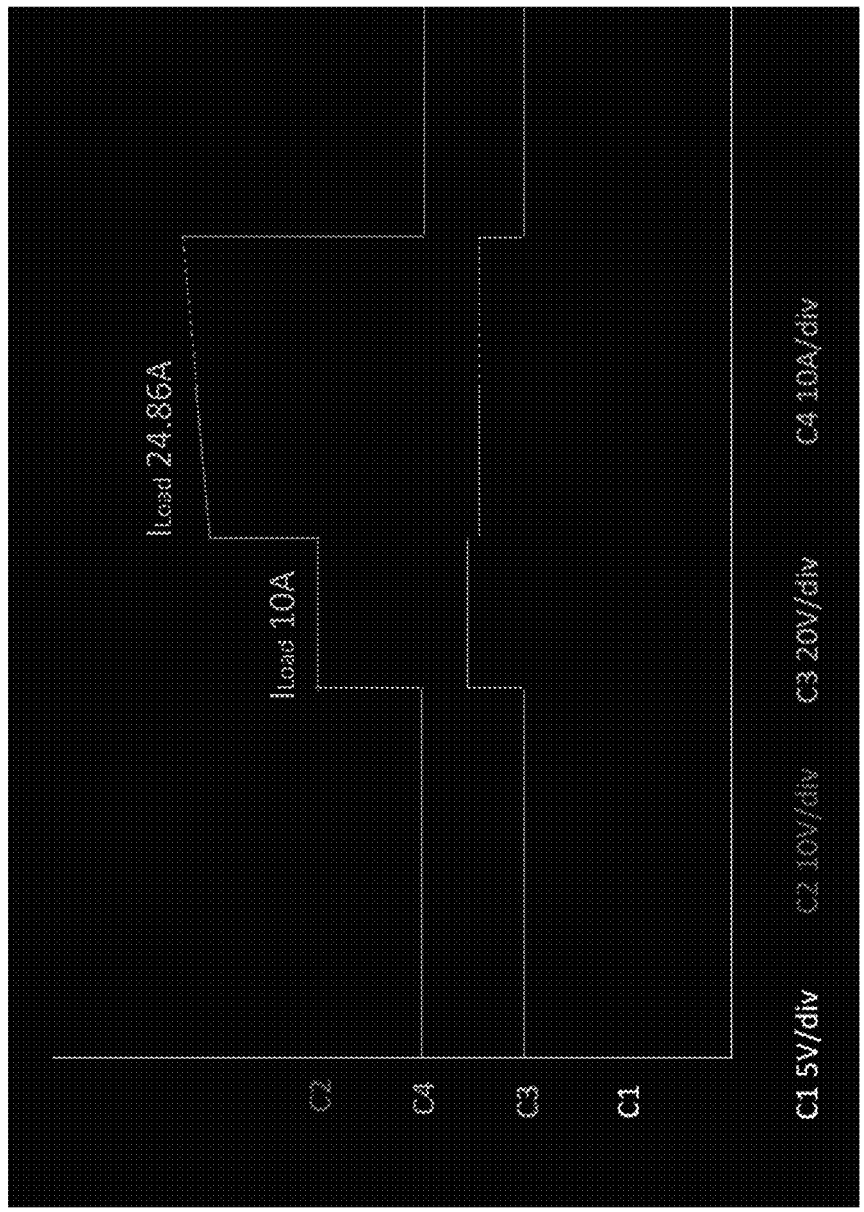
FIG. 23 depicts the voltage behavior of the protection circuit of FIG. 20 under another event scenario.

In FIG. 23, there is shown a case 2, where during an initial interval the power is off as shown. In the phase 1 period, during normal operation mode, the load current is 10 A and voltage Vin is 24V. A sudden load short of 40 A causes the transition to phase 2 period, where current is still limited to approximately 24 A, which value may be set by the transistor Q2. Note that in FIGS. 22 and 23 there is no specific time scale for the x-axis, because the duration of over current time and the exact Bi-metallic switch trip time will depend upon the temperature sensitivity and how tightly the DMOSFET is in contact with the bimetallic switch.

Figure 24:
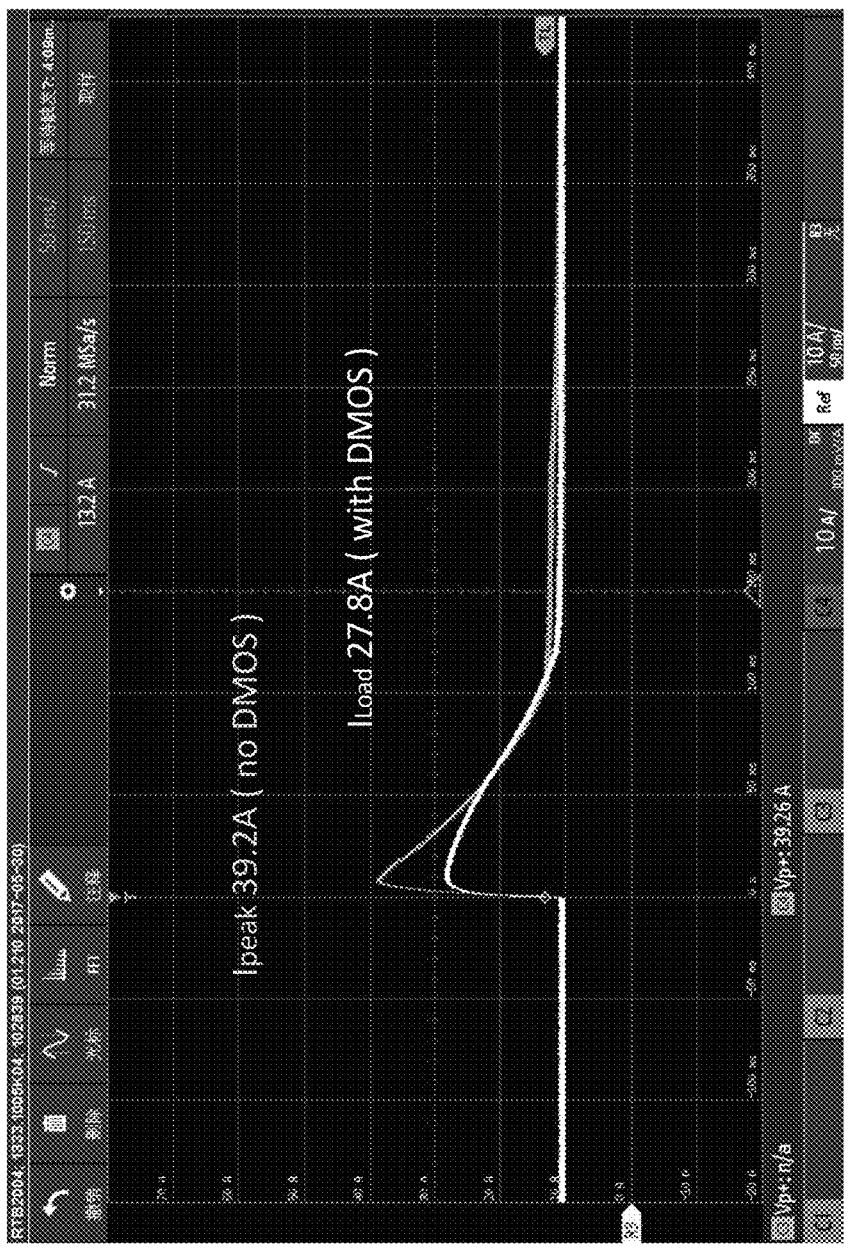
FIG. 24 and FIG. 25 depict the voltage behavior of the protection circuit of FIG. 20 under further event scenarios.

In FIG. 24, there is shown a case 3, where a load dump transient is shown under a test condition of 87V 1.5 ohm 400 mS ISO7637-2 5a Load dump test (RL set at 1 ohm @ DC+12V). Under normal operation, the load current is 10 A as shown. The test condition, initiated at time 0 s, generates a 39.2 A peak in the absence of the D MOSFET Q2, and internal control circuit 2006, while in the presence of the D MOSFET Q2 and internal control circuit 2006, as arranged in protection circuit 2000, the peak in surge current is suppressed to 27.8 A.

Figure 25:
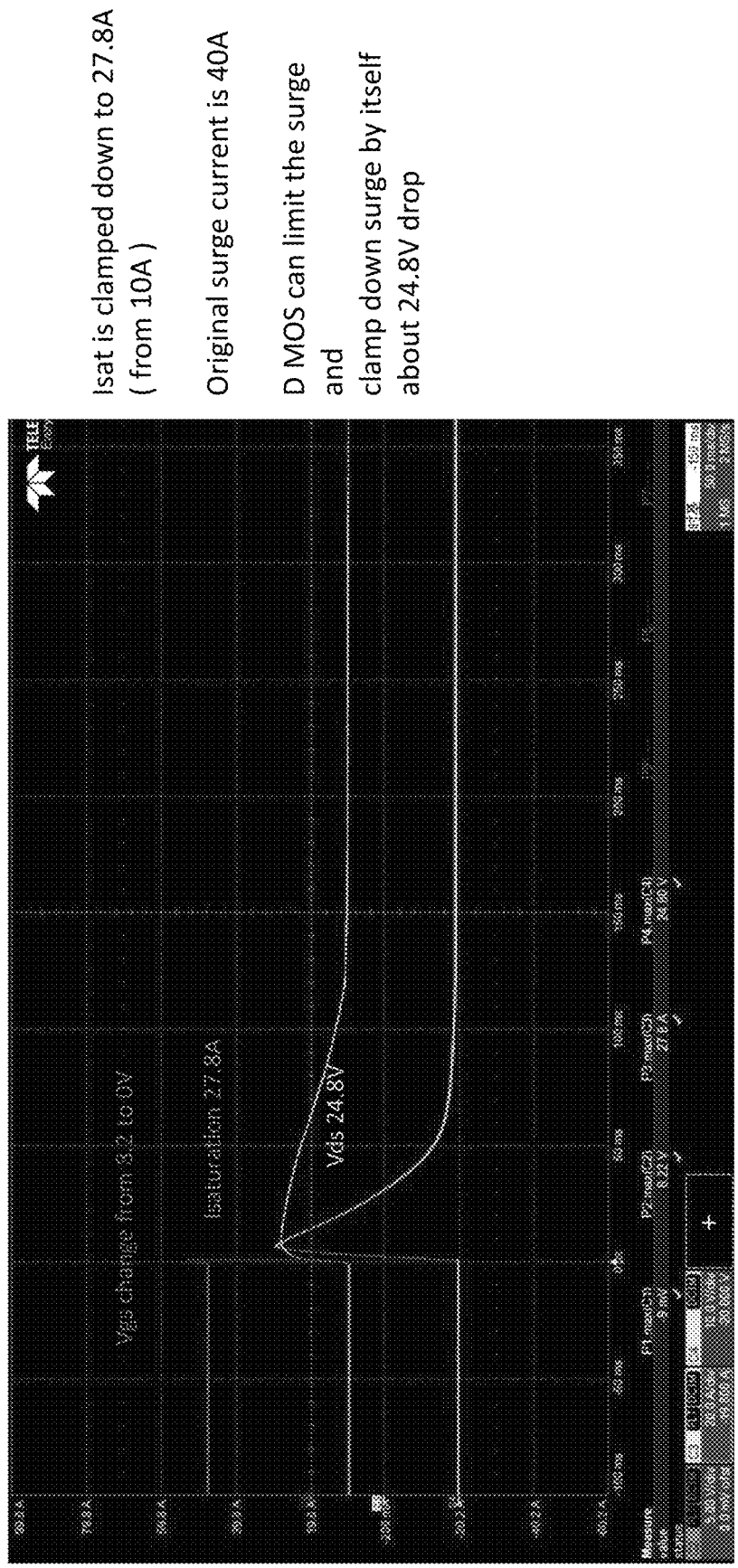

FIG. 25 shows more details of the behavior of the internal control circuit 2006 for case 3, where a load dump transient is shown under a test condition of 87V 1.5 ohm 400 mS ISO7637-2 5a Load dump test (RL set at 1 ohm @ DC+12V), with original surge current of 40 A. In this case, the lowest curve shows the drain-source voltage (Vds), which spikes at 24.8V after several milliseconds and decays toward zero after approximately 50 ms. The gate source voltage (Vgs) drops immediately from 8.2 V to zero V on the (ms) time scale shown, while the saturation current (Isaturation) is clamped to a maximum value of 27.8 A from an initial value of 10 A, and decays back to the initial value after approximately 125 ms.

Figure 26:
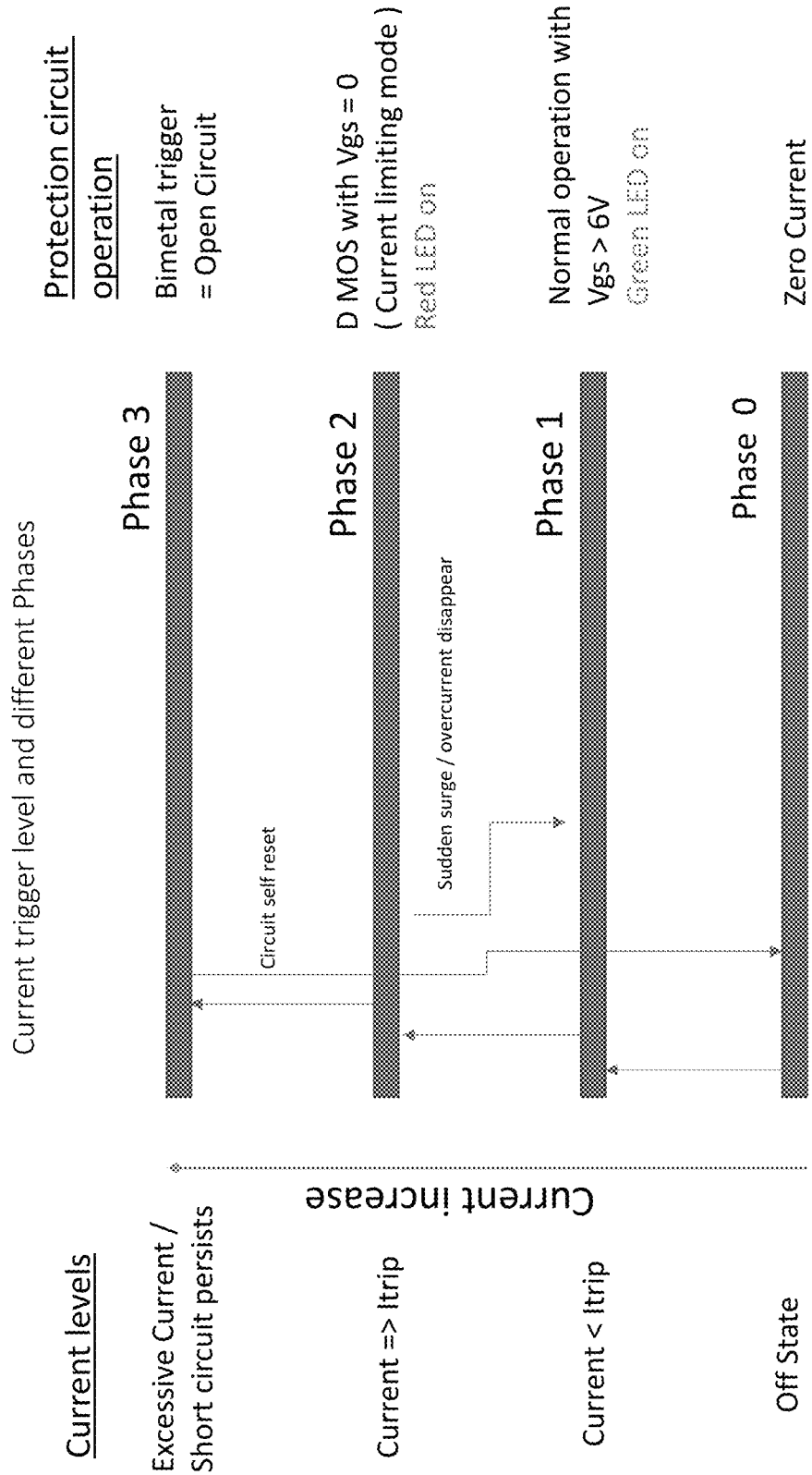
FIG. 26 presents a state diagram showing the interoperation of various different phases or modes of operation of the protection circuit of FIGS. 20-21.

FIG. 26 presents a state diagram showing the interoperation of various different phases or modes of operation of the protection circuit 2000. In an off state or phase zero, no current is flowing through the protection circuit. As shown to the far left of the diagram, the phase 1 state may be initiated by turning on power to a system or load to be protected, including turning on the protection circuit 200, causing current to flow through the protection circuit 2000. The current during the phase 1 state is below a level that causes the protection circuit 2000 to trip, causing the DMOSFET Q2 into a current limiting state. The gate to source voltage in the phase 1 state may be a predetermined value suitable for operation of the DMOSFET Q2, such as greater than 5 VV, greater than 6 V, greater than 8V, and so on. At this time, the protection circuit 2000 may emit a signal such as a green light to indicate normal operation.

When an event occurs, such as an overcurrent event, the current level may increase to a level characteristic of phase 2, where the current level flowing into the protection circuit 2000 is greater than or equal to a trip current that causes the DMOSFET Q2 to enter a current limiting state, as detailed above. In this state, the gate to source voltage is approximately zero, and an indicator signal, such as a red light, may be generated.

If excessive current or a short circuit persists the DMOSFET Q2 may heat up, causing the protection circuit 2000 to enter the phase 3 mode where the bimetallic switch is triggered to open, thus generating an open circuit condition. This event is shown by the circuit self-reset arrow, where the protection circuit 2000 drops to an off state of zero current. On the other hand, in the phase 2 state, if the surge current disappears or subsides before excessive overheating of the DMOSFET Q2 in the current limiting state, the protection circuit 2000 may just drop back to the phase 1 normal operation, where the current level detected by the OP amp comparator COM is below a preset value, causing the resetting of a high gate to source voltage at the DMOSFET Q2, and a restoration of low resistance current path through the source to drain of DMOSFET Q2.

In summary, the embodiment of the protection circuit 2000 provides a current limiter solution that is Uni-directional/Reverse blocking, and operates at semiconductor speed @μS. Moreover, a smart/Self trigger circuit is provided without external control that is automatic and resettable. The protection circuit 2000 also provides design flexibility/Programmable current & threshold, as well as a moderate power and size.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A protection circuit, comprising: a bi-metallic strip having an input side and an output side to couple along an input path to a load; a depletion mode field effect transistor (D MOSFET) connected in series with and thermally tied to the bi-metallic strip, the D MOSFET having a source terminal, coupled to a ground path; and an internal control circuit, wherein the internal control circuit is connected between the input path and ground path and is coupled to a gate terminal of the D MOSFET, the internal control circuit comprising: a transient voltage suppression (TVS) diode, coupled between the input path and the ground path; a switching MOSFET, having a drain terminal coupled to the gate terminal of the D MOSFET; and an Op amp comparator, coupled to a drain terminal of the D MOSFET.

2. The protection circuit of claim 1, wherein an anode of the TVS diode is coupled to the ground path.

3. The protection circuit of claim 1, wherein a drain terminal of the switching MOSFET is coupled to the gate terminal of the D MOSFET.

4. The protection circuit of claim 1, wherein the internal control circuit is arranged on a printed circuit board.

5. The protection circuit of claim 1, further comprising a first light emitting diode, having an anode coupled to the gate terminal of the D MOSFET.

6. The protection circuit of claim 1, further comprising a second light emitting diode, having an anode coupled to an output side of the OP amp comparator.

7. The protection circuit of claim 1, further comprising a resistor network, coupled to an input side of the OP amp comparator.

8. A method of controlling an electrical current through a load line, comprising:
- passing the electrical current through a bimetallic switch formed of a bimetallic strip to a depletion mode transistor of a protection circuit that is coupled to the load line;
- determining a current value of the electrical current, after passing through the bimetallic strip; and
- outputting a high signal to a switching transistor when an overcurrent condition occurs, wherein the current value reaches a preset level, wherein the switching transistor generates a short circuit across the depletion mode transistor, and wherein the depletion mode transistor enters a low bias saturation that limits a level of the electrical current;
- wherein the depletion mode transistor comprises a first field effect transistor, wherein the short circuit is generated between a gate and a source of the depletion mode transistor.

9. The method of claim 8, wherein, when the overcurrent condition persists so as to heat the depletion mode transistor, the bimetallic switch opens upon reaching a trigger temperature, wherein the electrical current ceases flow through the protection circuit.

10. The method of claim 8, wherein the outputting the high signal is performed by an OP amp comparator that receives the current value of the electrical current and compares the current value to the preset level, and wherein the preset level is set by a resistor network of the protection circuit.

11. The method of claim 10, wherein an output of the OP amp comparator is coupled to a red light emitting diode, wherein the high signal automatically turns the red light emitting diode on.

12. The method of claim 8, further comprising generating an output signal at a green light emitting diode, coupled to a gate terminal of the depletion mode transistor, when the current value is below the preset level.

13. The method of claim 12, wherein an anode of the green light emitting diode is coupled to a gate terminal of the depletion mode transistor, wherein the depletion mode transistor is biased at a high voltage level, greater than 8 V when the current value is below the preset value, and wherein the high voltage level automatically biases the green light emitting diode to turn on.

14. The method of claim 8, wherein the switching transistor comprises a second field effect transistor, wherein the high signal automatically sets the switching transistor to an ON state, and wherein the depletion mode transistor is automatically placed in a zero voltage bias state where a gate to source voltage Vgs is approximately zero volts, when the switching transistor is in the ON state.

15. The method of claim 14, wherein in the zero voltage bias state, the depletion mode transistor acts as a current limiter to limit the electrical current to a maximum value corresponding to a saturation current (Isat) of the depletion mode transistor.

\* \* \* \* \*